(12) United States Patent
Aratani

(10) Patent No.: US 6,909,625 B2
(45) Date of Patent: Jun. 21, 2005

(54) METHOD TO PRODUCE DATA CELL REGION AND SYSTEM REGION FOR SEMICONDUCTOR MEMORY

(75) Inventor: Katsuhisa Aratani, Chiba (JP)

(73) Assignee: Sony Corporation, Tokyo (JP)

(*) Notice: Subject to any disclaimer, the term of this patent is extended or adjusted under 35 U.S.C. 154(b) by 490 days.

(21) Appl. No.: 10/006,007

(22) Filed: Dec. 4, 2001

(65) Prior Publication Data

US 2002/0038876 A1 Apr. 4, 2002

Related U.S. Application Data

(62) Division of application No. 09/233,653, filed on Jan. 19, 1999, now Pat. No. 6,384,435.

(30) Foreign Application Priority Data

Jan. 20, 1998 (JP) .......................................... P10-008170

(51) Int. Cl.⁷ .......................... G11C 17/06; G11C 11/36
(52) U.S. Cl. ........................ 365/105; 365/175; 438/128; 438/237; 438/694; 438/700
(58) Field of Search ................................ 365/174, 175, 365/103, 105; 438/128, 237, 612, 694, 700, 725, 737

(56) References Cited

U.S. PATENT DOCUMENTS

| | | | | |
|---|---|---|---|---|
| 4,581,718 A | * | 4/1986 | Oishi | 365/194 |
| 4,901,284 A | * | 2/1990 | Ochii et al. | 365/226 |
| 4,937,787 A | * | 6/1990 | Kobatake | 365/185.22 |
| 4,958,316 A | * | 9/1990 | Ochii et al. | 365/63 |
| 5,208,782 A | * | 5/1993 | Sakuta et al. | 365/230.03 |
| 5,604,365 A | * | 2/1997 | Kajigaya et al. | 257/296 |
| 5,640,343 A | * | 6/1997 | Gallagher et al. | 365/171 |
| 5,656,548 A | * | 8/1997 | Zavracky et al. | 438/23 |
| 5,781,031 A | * | 7/1998 | Bertin et al. | 326/39 |
| 5,793,115 A | * | 8/1998 | Zavracky et al. | 257/777 |
| 5,915,167 A | * | 6/1999 | Leedy | 438/108 |
| 6,247,073 B1 | * | 6/2001 | Takeda | 710/61 |
| 6,384,435 B1 | * | 5/2002 | Aratani | 257/208 |

* cited by examiner

*Primary Examiner*—M. Wilczewski
(74) *Attorney, Agent, or Firm*—Sonnenschein, Nath & Rosenthal LLP

(57) ABSTRACT

The present invention relates to a memory and an information apparatus and more specifically realizes a memory having large capacity through a simplified process and an information apparatus utilizing the same memory by generating the data cell region with a process that is different from the process used to generate the system region to control the data cells.

26 Claims, 18 Drawing Sheets

FIG. 18
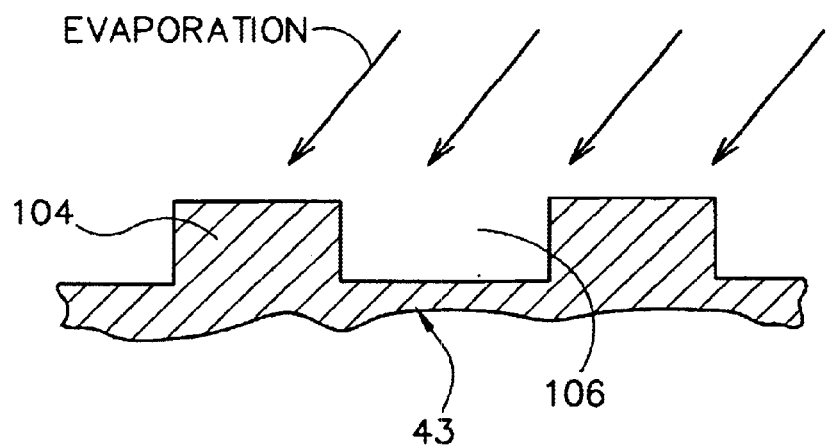
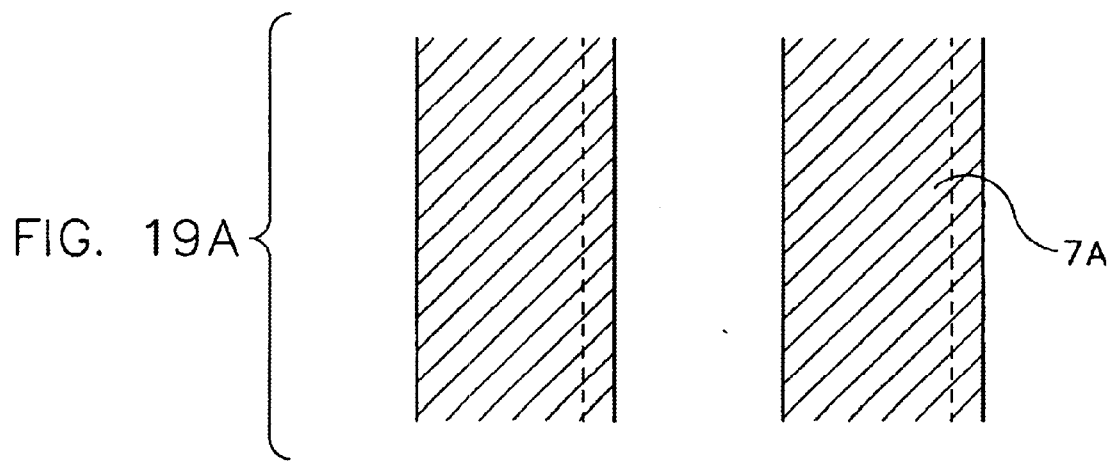
FIG. 19A
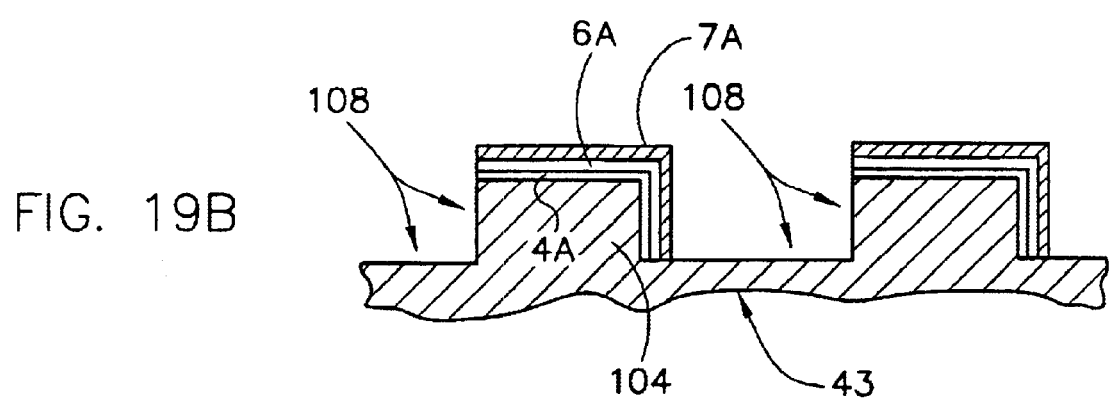
FIG. 19B

METAL LAYER 4A
pn SILICON LAYER 6A

METAL LAYER 4A
pn SILICON LAYER 6A

METHOD TO PRODUCE DATA CELL REGION AND SYSTEM REGION FOR SEMICONDUCTOR MEMORY

RELATED APPLICATION DATA

This patent is a divisional application of U.S. Ser. No. 09/233,653 filed on Jan. 19, 1999 now U.S. Pat. No. 6,384,435. Moreover, this patent claims priority to Japanese Application No. P10-008170, filed Jan. 20, 1998. Both of these applications are incorporated by reference to the extent permitted by law.

BACKGROUND OF THE INVENTION

1. Field of the Invention

The present invention includes memory and an information apparatus which may be applied, for example, to a read only memory, random access memory, or to an apparatus utilizing these memories. The present invention also includes a memory which may increase its capacity with a simplified process. Moreover, the invention includes an information apparatus utilizing this memory by generating data cell regions using a process other than that used to generate the system region to control data cells.

2. Description of the Related Art

Memory may be thought of as any device that can hold data in a machine-readable format. Moreover, a semiconductor may be viewed as material, typically crystalline, which allows current to flow under certain circumstances and may be used to create various integrated circuits. Most memory devices used in the computer industry are built from semiconductor integrated circuits.

In a conventional semiconductor memory, such as a dynamic random access memory (DRAM), data cells may be formed by a charge accumulation mechanism and are arranged in the shape of a matrix. Access is made to these data cells from a system region. Thereby, data may be written by accumulating charges to the desired data cells corresponding to a cell address. Data is read out by detecting the accumulated charges held in these data cells.

A conventional semiconductor memory is produced through an ultra-fine manufacturing process by forming, on a semiconductor substrate, the data cell regions formed by both the data cells and system regions to control operation of the data cell regions. Such a semiconductor memory has the merits that reliability is high and access time and data transfer time is very short as compared to a magnetic tape represented by a videotape recorder and a disk memory represented by a compact disk.

Creation of conventional semiconductor memory requires large-scale facilities, such as a clean room and stepper, for the ultra-fine manufacturing process. Particularly when memory capacity is increased by modifying a design rule, the facilities for such ultra-fine manufacturing must be updated or newly constructed, raising unit price per bit.

SUMMARY OF THE INVENTION

In view of overcoming the disadvantages of the related art, the present invention produces the data cell region and system region with different manufacturing processes.

When the data cell region and system region are manufactured with the processes of the invention, the data cell region and system region may be manufactured with the most applicable manufacturing processes and thereby a large capacity memory may be generated with a more simplified overall process.

BRIEF DESCRIPTION OF THE DRAWINGS

FIG. 18 is a cross-sectional view for explaining evaporation in generation of word lines.

FIGS. 19A and 19B are, respectively, a plan view and a cross-sectional view showing the word lines generated by the evaporation of FIG. 18.

DESCRIPTION OF THE PREFERRED EMBODIMENTS

The preferred embodiments of the present invention will be explained with reference to the accompanying drawings.

(1) First Embodiment (1-1) Structure of the First Embodiment

Figure 1:
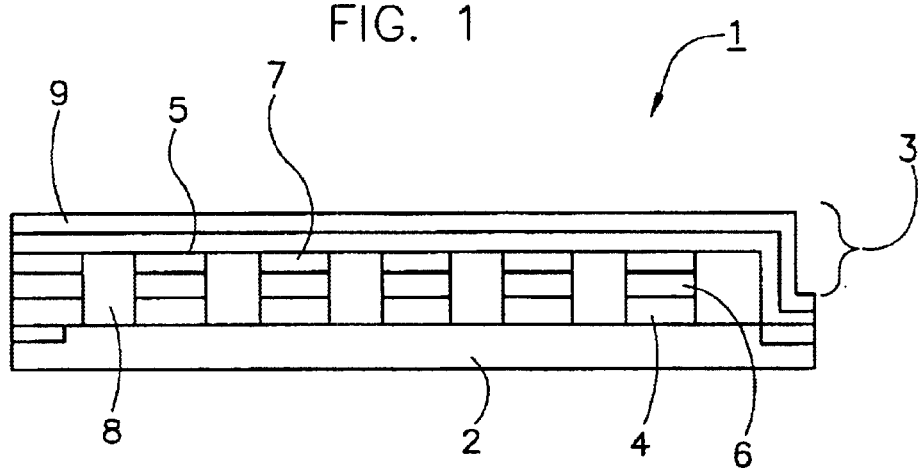
FIG. 1 is a cross-sectional view showing a memory chip as a first embodiment of the present invention.

FIG. 1 is a cross-sectional view showing a memory chip of a random access memory (RAM) as a first embodiment of the invention. A memory of this embodiment is formed by accommodating this memory chip 1 into a package. This memory chip 1 is formed by disposing a data cell region 3 on a memory substrate 2.

Namely, this data cell region 3 is structured, in FIG. 1, by a plurality of word lines 4 extending in the direction across the paper surface in the vertical direction, a plurality of bit lines 5 extending at right angles (orthogonal) to the word lines 4, diodes 6 formed by stacking of layers between the word lines 4 and bit lines 5 almost at the intersecting points of the word lines 4 and bit lines 5 and recording layers 7.

Thereby, the data cell region 3 arranges in the shape of matrix data cells formed by diode 6 and recording layer 7. A data cell may be accessed with the word line 4 and bit line 5. This recording layer 7 is formed of germanium antimony tellurium (GeSbTe) and may be composed of a binary compound of at least one of oxygen, sulfur, selenium, and tellurium to create a chalcogenide semiconductor material. The recording layer 7 also may be formed of TeAsSiGe, GeTeSSb or AgInSbTe, etc. composed of such chalcogenide semiconductor. Moreover, the data cell region 3 is insulated by the interlayer insulating layer 8 between the word lines 4, between bit lines 5 and between data cells and it is protected as a whole by a protection layer 9.

The data cell region 3 includes, through a work line generating process, the work lines 4, diodes 6 and recording layer 7 on the memory substrate 2 and thereafter generates the interlayer insulating layer 8 between the word lines 4 by the interlayer insulating film layer generating process. With the subsequent bit line generating process, the bit lines 5 are generated and, after the interlayer insulating layer 8 is generated by the interlayer insulating layer film generating process between the bit lines 5 and between data cells, the protection layer 9 is generated.

Figure 2:
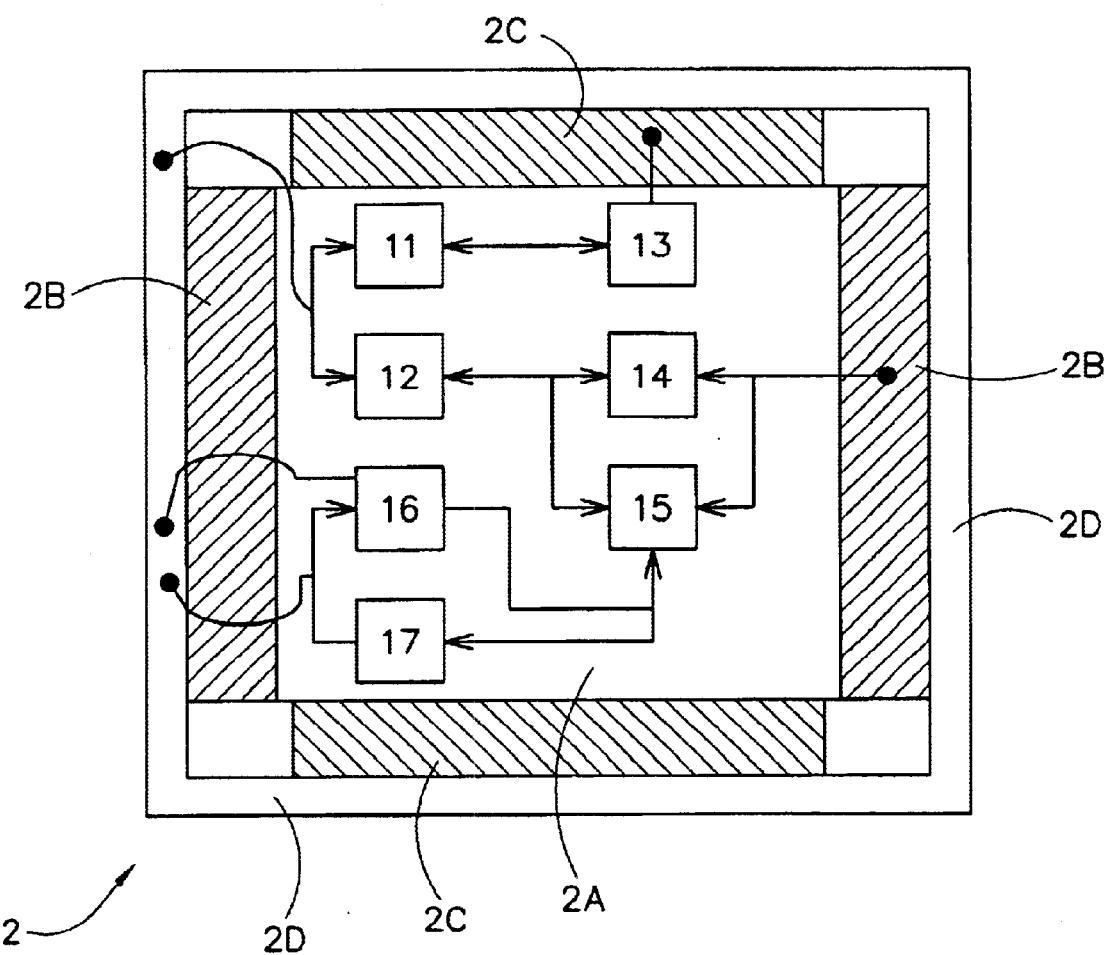
FIG. 2 is a plan view showing a memory substrate of FIG. 1.

FIG. 2 is a plan view showing a memory substrate 2. The memory substrate 2 includes, through a semiconductor process, a system region 2A by peripheral circuits at the center of substrate 2 of almost rectangular shape and also arranges the bit line electrode pad 2B, word line electrode pad 2C and external connection electrode pad region 2D surrounding the system region 2A.

The external connection electrode pad region 2D includes an external connection electrode pad connected to the system region 2A and each external connection electrode pad is connected, for example, to a terminal of a package by a bonding method. The bit line electrode pad 2B connects the system region 2A and bit lines 5 of data cell region 3 and the word line electrode pad 2C connects the system region 2A and the word lines 4 of data cell region 3.

The memory substrate 2 may be manufactured by using comparatively old facilities among the ultra-fine manufacturing apparatus and ultra-fine manufacturing facilities to be applied to the semiconductor processes because the pattern width of wiring patterns is wider than the wiring pattern width of the data cell region 3.

Figure 3:
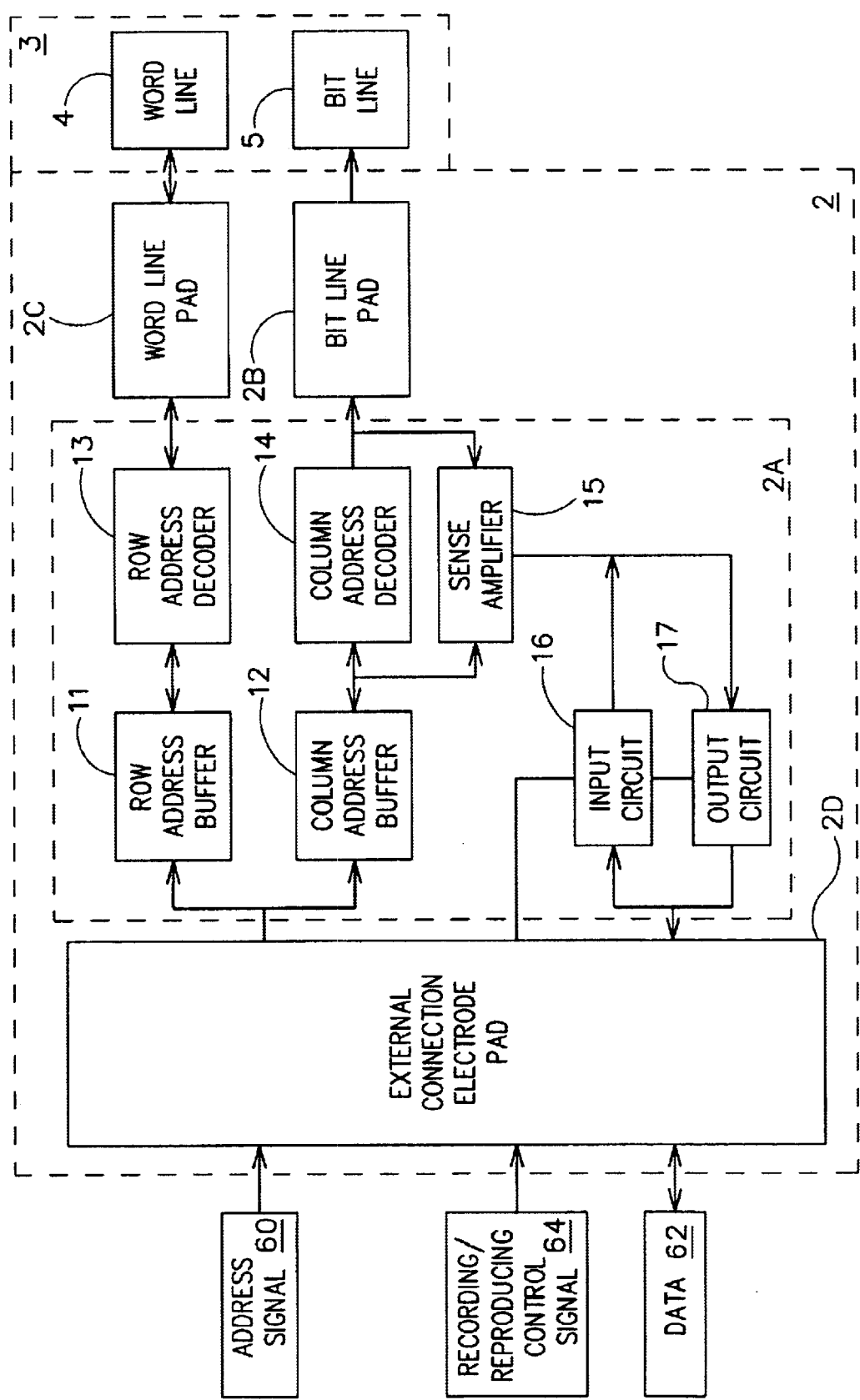
FIG. 3 is a block diagram showing a system region to be arranged on the memory substrate of FIG. 2.

As shown in FIG. 3, the system region 2A is provided with a row address buffer 11 and a column address buffer 12 to hold the address signal 60 input via the external connection electrode pad 2D as separated into the row address and column address corresponding to the structure of the data cell region 3. System region 2A also may include a row address decoder 13 and a column address decoder 14 to select the word line 4 and bit line 5 of the data cell region 3 by decoding the address held respectively in the row address buffer 11 and column address buffer 12.

The system region 2A also is provided with an input circuit 16 to drive a sense amplifier 15 with the data 62 input via the external connection electrode pad 2D to record the data 62 to the data cell selected by the row address decoder 13 and column address decoder 14 and an output circuit 17 to drive, on the contrary, the sense amplifier 15 to read and output the data from the data cell selected by the row address decoder 13 and column address decoder 14. The input circuit 16 and output circuit 17 execute these operations with the recording/reproducing control signal 64 input via the external connection electrode pad 2D.

Figure 4C:
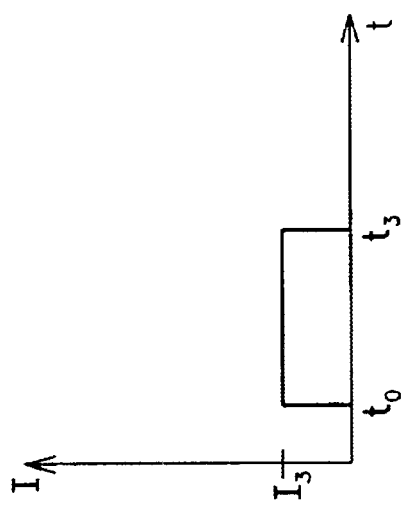
FIGS. 4A to 4C are signal waveform diagrams for explaining operations of a sense amplifier of FIG. 3.
Figure 4B:
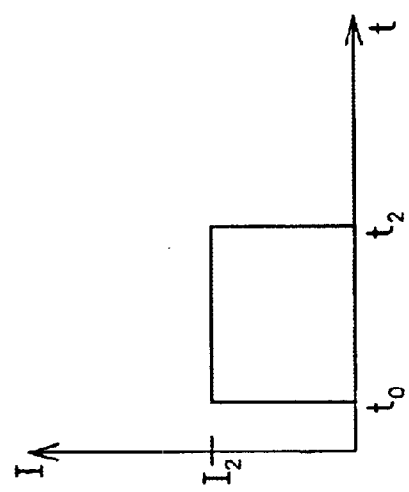
Figure 4A:
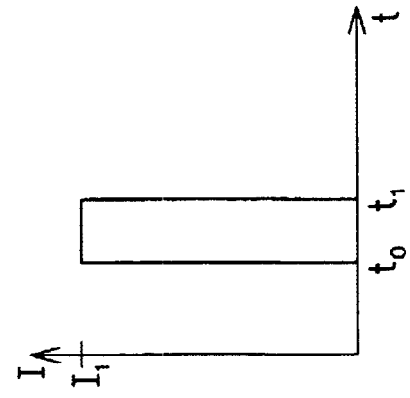

The sense amplifier 15 applies the predetermined voltage, as shown in FIG. 4A, at the time of recording the data of logic 1 under the control of the output circuit 17, so that a heavier current ($I_1$) flows within a short period ($t_1$) in the recording layer 7 of the memory chip selected by the row address decoder 13 and column address decoder 14. This rapidly heats a localized address area of recording layer 7 to an uncrystallized state. At the end of the short period of time, the sense amplifier 15 rapidly sets GeSbTe to a lower temperature after setting it to the temperature higher than the predetermined temperature to fix the recording layer 7 in the uncrystallized (amorphous) condition.

On the contrary, as shown in FIG. 4B, the predetermined voltage is applied, on the occasion of the recording the data of logic 0 under the control of the output circuit 17, so that a current ($I_2$) lower than that for recording the data of logic 1 flows for a longer period ($t_2$) in the recording layer 7 of the memory chip 1 selected by the row address decoder 13 and column address decoder 14. Thereby, after GeSbTe is set to the temperature higher than the predetermined temperature, temperature is gradually lowered to crystallize the recording layer 7.

Moreover, during the data reproducing condition, as shown in FIG. 4C, the predetermined voltage is impressed to detect a current $I_3$ flowing to the recording layer 7 with a sense amplifier 15 and this current $I_3$ is output through binary discrimination.

Thereby, the desired data may be recorded or recorded data may be reproduced through the resistance values of the recording layer 7 which are different under the amorphous condition and crystallized condition. In other words, recorded data information may be represented by a set of resistance values within the recording layer 7, where these resistance values are a function of localized crystal structures within the recording layer 7. A known, predetermined voltage may be passed over one resistance value to generate a current I. The current I travels to sense amplifier 15 where it is detected and passed onto output circuit 17. Output circuit 17 employs binary discrimination to pass the recorded data information to the external connection electrode pads 2D.

Figure 5A:
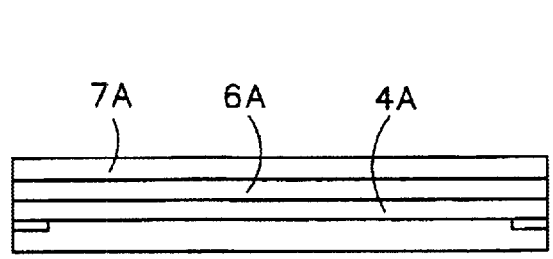
FIGS. 5A to 5E are cross-sectional views for explaining generation of word lines of a data cell region of FIG. 1.
Figure 5B:
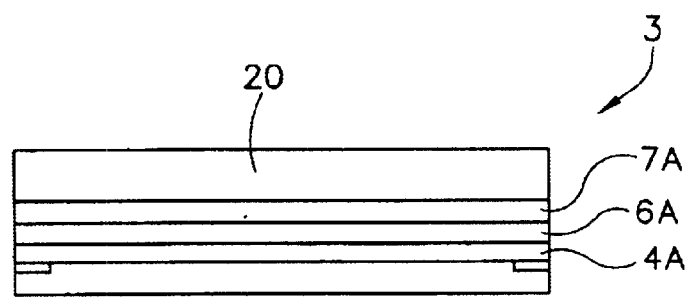

FIGS. 5A–E are cross-sectional views of a memory chip 1 for explaining the word line 4 generation process. In this embodiment, the data cell region 3 forms a metal layer 4A to the entire surface of the memory substrate 2. Here, the metal layer 4A is a metal thin film of aluminum, gold, copper, tungsten, titanium, nickel, polysilicon or silicide, etc. and may be formed by the thin film forming method such as sputtering, evaporation or Chemical Vapor Deposition (CVD), etc. (FIG. 5A.) The metal layer 4A may be generated with a kind of metal material or with a plurality of kinds of metal materials.

Subsequently, in the data cell region 3, after a P-type amorphous silicon is deposited on the metal layer 4A by the low temperature CVD process, etc., the N-type amorphous silicon is deposited thereon. Moreover, annealing is performed to generate pn-silicon layer 6A of the polycrystal silicon. Thereafter, a recording film 7A is deposited on the data cell region 3 through the thin film generating technique such as sputtering, evaporation and CVD, etc.

Subsequently, in the data cell region 3, the recording film 7A is coated with an ultraviolet-setting resin 20 (FIG. 5B), a stamper 21 is pressed (FIG. 5C), after the ultraviolet-setting resin 20 hardened under this condition as resin 20A, the stamper 21 is peeled. Here, the stamper 21 is formed like a sheet, for example, of nickel material in the thickness of 0.1 to 0.4 [mm] to have flexibility for bending, forming the recessed groove at the pressing surface corresponding to the word line 4. Thereby, the protruded area 66 and recessed area 68 of stamper 21 of data cell region 3 are transferred by the so-called 2P (Photo-Polymerized) method and thereby protruded 70 and recessed 72 areas are formed in the ultraviolet-setting resin 20A on the recording film 7A so that the word line 4 becomes thick. In place of the ultraviolet-setting resin 20, a thermo-setting resin or photoresist also may be applied. The stamper 21 also may be structured with glass, plastic and metal materials. Thereby, the stamper 21 forms the reference member 20A having the protruded 70 and recessed 72 areas that correspond to the wiring pattern eventually formed as the word line 4.

Figure 6:
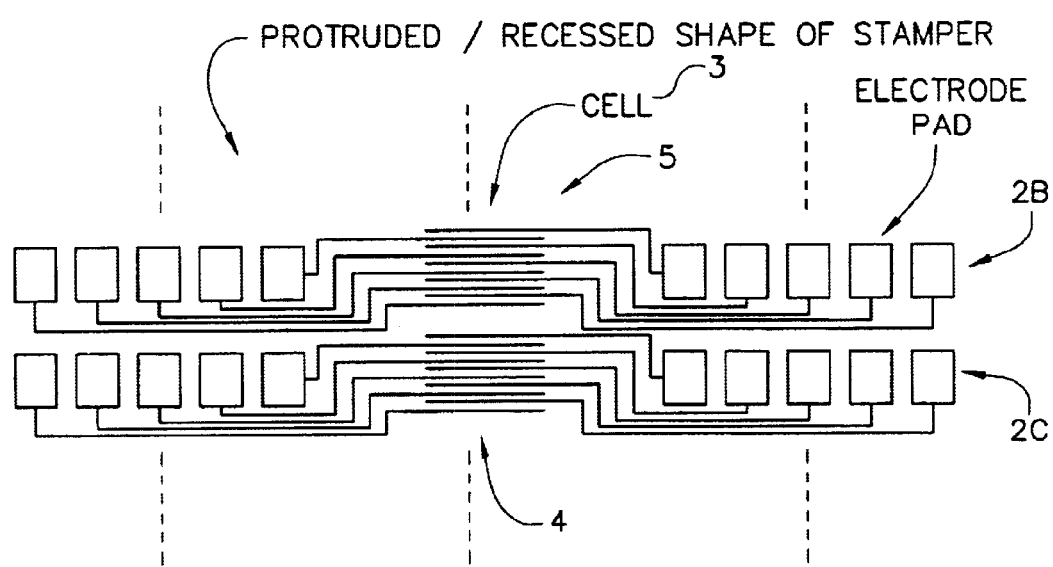
FIG. 6 is a plan view for explaining electrodes for connecting word lines to the memory substrate.

On the occasion of generating the protruded 70 and recessed 72 areas corresponding to the word line 4 by pressing the stamper 21 as explained above, in the area overlapping with the word line electrode pad 2C (FIG. 2), as shown in the enlarged pressing surface of FIG. 6, the recessed area 72 is formed at the pressing surface so that the protruded area 70 is formed corresponding to the shape of the word line electrode pad 2C. Here, the word line electrode pad 2C is formed with remarkably loose period in comparison with the word line 4 and in the larger area.

Figure 5C:
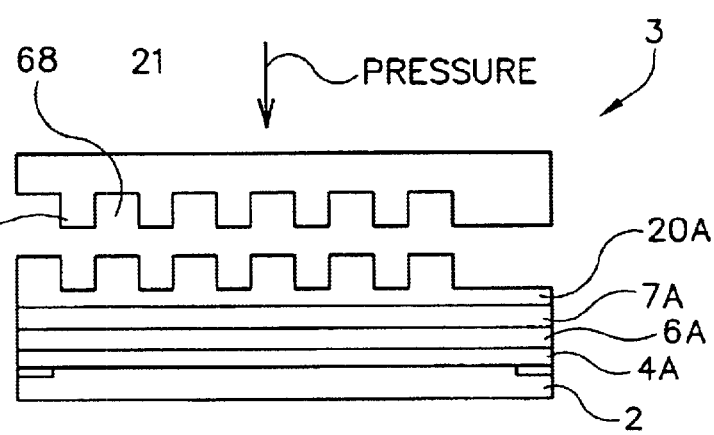
Figure 5D:
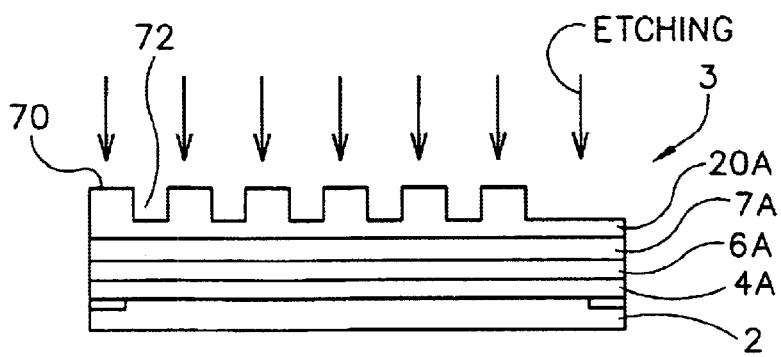
Figure 5E:
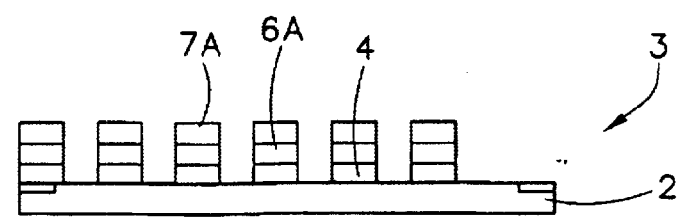

Therefore, as seen in FIG. 5D, the data cell area 3 is processed at the protruded area 70 of the ultraviolet-setting resin 20A leaving the metal layer 4A, pn silicon layer 6A and recording film 7A to structure the word line 4 and diode 6 of FIG. 5E. Thereby, the word line 4 generated as explained above may be connected to the word line electrode pad 2C through the simplified alignment of the stamper 21. In FIG. 6, length in the right and left direction of cell area is reduced.

Subsequently, the data cell area 3 is subject to execution of uniform etching process from the surface of the ultraviolet-setting resin 20A to which the protruded 70 and recessed 72 areas are transferred (FIG. 5D), the metal layer 4A, pn silicon layer 6A and recording film 7A are removed from the recessed area 72 of the ultraviolet-setting resin 20A and the metal layer 4A, pn silicon layer 6A, recording film 7A are left for the protruded area of the ultraviolet-setting resin 20A (FIG. 5E). This etching process is executed by the dry-etching such as ion milling, plasma etching, RIE (Reactive Ion Etching), etc.

In this case, the layers up to the metal layer 4A may be removed by a single etching process a plurality of etching processes. Here, an excellent result may be obtained by setting the etching rates of ultraviolet-setting resin 20, metal layer 4A, pn silicon layer 6A and recording film 7A to almost equal rate and then setting the etching rate of the memory substrate 2 to a very lower rate. In this case, selection ratio, stability and controllability of the etching may be improved by introducing different kinds of material into the material of the metal layer 4A.

Figure 7:
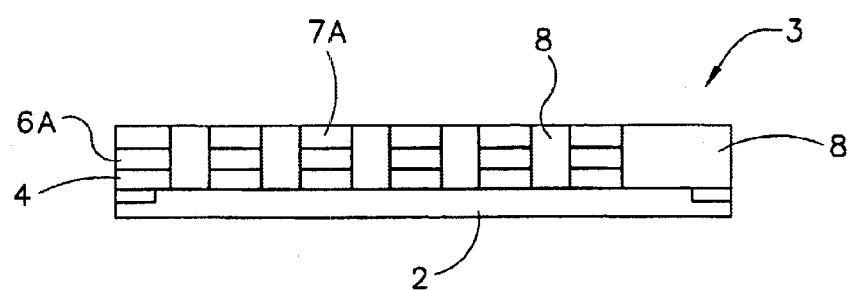
FIG. 7 is a cross-sectional view for explaining a generation process of an interlayer insulating layer.
Figure 8A:
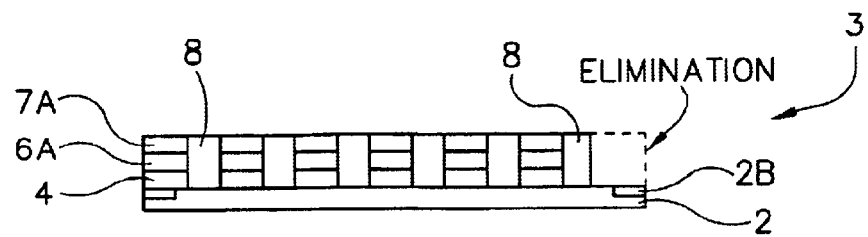
FIGS. 8A to 8E are cross-sectional views for explaining generation of bit lines of the data cell region of FIG. 1.

Subsequently, for the data cell region 3, the interlayer insulating layer 8 between the word lines 4 is generated as shown in FIG. 7 in the interlayer insulating layer generation process. Here, the interlayer insulating layer 8 is formed by vertical evaporation, for example, of $SiO_2$, $Si_3N_4$ to the substrate 2. Thereafter, any ultraviolet-setting resin 20A remaining on the recording film 7A and the $SiO_2$ deposited on this ultraviolet-setting resin 20A are removed by the etching process so that the recording film 7A is exposed at the surface. Subsequently, in the data cell region 3, as shown in FIG. 8A, the interlayer insulating layer 8 above the bit line electrode pad 2B is removed by the photolithography in the bit line generation process.

The bit line 5 is generated like the word line 4. Moreover, in this case, the continuous pn silicon layer 6A and recording film 7A are isolated for the bit line 5 direction and thereby data cell by the diode 6 and recording layer 7 is generated on the basis of so-called self-alignment.

Figure 8B:
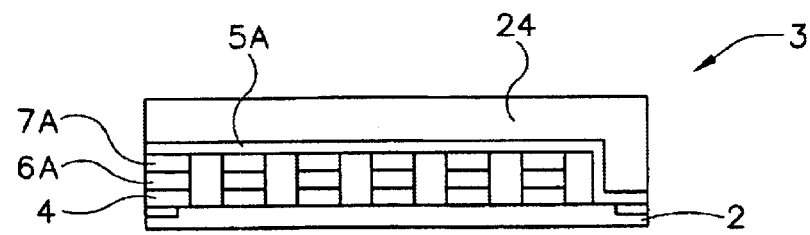
Figure 8C:
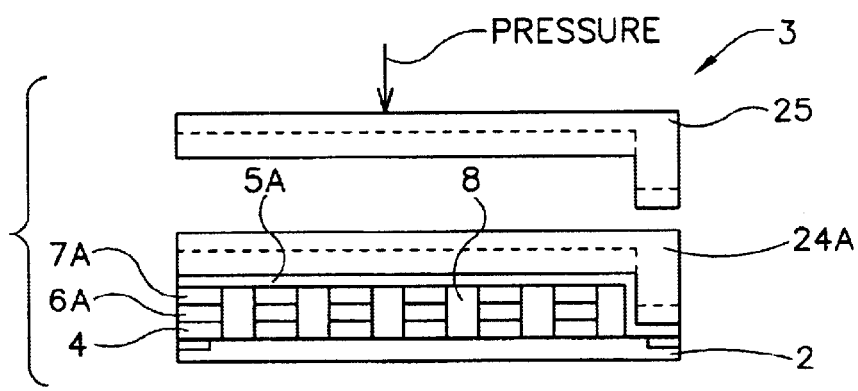

Namely, in the data cell region 3, as shown in FIG. 8B, after the metal layer 5A is generated, the ultraviolet-setting resin is coated over metal layer 5A. Thereafter, as shown in FIG. 8C, the ultraviolet-setting resin 24 is hardened as a resin 24A because the stamper 25 is pressed, and the stamper 25 is peeled and thereby the protruded and recessed areas of stamper 25 are transferred so that a part of the bit line 5 is protruded. In this case, the bit line electrode pad 2B of stamper 25 is formed in remarkably loose period than the bit line 5 as in the case of the word line 4 and in a large area. Therefore, the word line 5 may be generated through more simplified alignment.

Figure 8D:
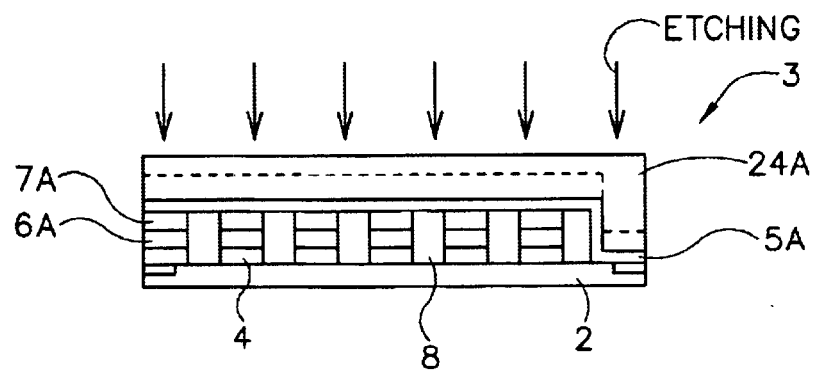
Figure 8E:
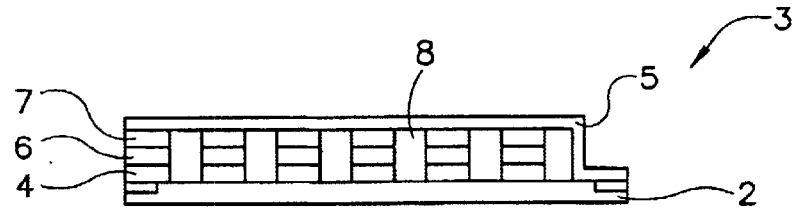

Subsequently, as shown in FIG. 8D, in the data cell region 3, the uniform etching process is executed from the surface of the ultraviolet-setting resin 24A to which the protruded and recessed areas of stamper 25 are transferred, the metal layer 5A is removed from the recessed area of the ultraviolet-setting resin 24A and the metal layer 5A is removed from the protruded area of the ultraviolet-setting resin 24 to form the bit line 5 (FIG. 8E). Moreover, for the recessed area of the ultraviolet-setting resin 24, the metal layer 5A and recording layer 7A formed of the lower layer of this metal layer 5A and the pn silicon layer 6A are removed and thereby the data cell area by the diode 6 and recording layer 7 is generated.

When the bit line 5 is generated as explained above, the data cell region 3 forms the interlayer insulating layer 8 as in the case of the word line 4. Thereby, the area between the bit lines 5 and area between data cells extending continuously in the direction to the word line 4 are insulated 8 and thereafter a protection film 9 is generated as a whole. As explained above, when the data cell region 3 is generated, a memory chip 1 is packaged through the inspection process.

The memory chip 1 is subjected to the scribing process chip by chip and is then packaged after a series of processes are executed on a plurality of memory substrates 2 formed continuously on the semiconductor wafer.

(1-2) Operation of First Embodiment

In the structure explained above, this memory chip 1 (FIG. 1) allows formation of the system region 2A (FIG. 2), electrode pads 2B, 2C by techniques such as photolithography on the semiconductor wafer (FIG. 2) and thereby a plurality of memory substrates 2 are generated on a sheet of semiconductor wafer. Moreover, after the corresponding data cell region 3 is formed on each memory substrate 2 (FIG. 1), the scribing process is executed through the predetermined process and packaging is conducted. Here, it is also possible to use the glass or plastic substrate where the system region is formed in the Thin Film Transistor (TFT), etc. in place of the semiconductor wafer explained above.

Thereafter, each memory chip 1 may be generated by assigning the system region 2A to the area almost equal to that of the data cell region 3. Namely, in the memory chip of the related art, the data cell region and system region are arranged in two dimensions on the semiconductor substrate and only the data cell region among them occupies the greater area of the memory chip. However, in this embodiment, the system region 2A is arranged almost in the same area as the data cell region 3.

Accordingly, the pattern layout rule to generate the system region 2A may be set very loosely and thereby the process may be set so far easily and the memory chip 1 may be generated by the simplified facility. That is, the wiring pattern of the memory substrate 2 may be formed wider than the wiring pattern of the data cell region 3. Thereby, the system region 2A may be generated using rather old facilities among the ultra-fine manufacturing apparatus and ultra-fine manufacturing facilities to be applied to the semiconductor process.

Moreover, the data cell region 3 may be generated with the exclusive process which is different from that for the memory substrate 2 by fabricating the data cell region 3 on the memory substrate 2. Therefore, the system region 2A and data cell region 3 may be formed respectively with the adequate processes and accordingly the memory chip 1 may be generated by the simplified facility.

Namely, the memory chip 1 may be formed by the following processes. After the metal layer 4A, pn silicon layer 6A and recording layer 7A are sequentially formed on the memory substrate 2, the ultraviolet-setting resin 20 is coated, and the protruded 70 and recessed 72 areas in the shape of word line 4 are formed by pressing the stamper 21 to this untraviolet-setting resin 20 (FIG. 5C). With the uniform etching utilizing this protruded 70 and recessed 72 areas, the metal layer 4A, pn silicon layer 6A and recording film 7A are removed conforming to the protruded 70 and recessed 72 areas. Thereby, the word line 4, and the pn silicon layer 6A and recording film 7A deposited on the word line 4 may be formed.

Moreover, after the area between the word lines 4 is insulated by the interlayer insulating layer 8, a metal layer 5A is formed. In addition, the protruded and recessed areas of the bit line 5 shape may be formed by transfer process using the ultraviolet-setting resin 24 (FIG. 8B) and stamper 25 (FIG. 8C). With the uniform etching using such protruded and recessed area shape, the metal layer 5A, pn silicon layer 6A and recording film 7A may be removed and thereby the bit line 5 (FIG. 8E) may be generated. Simultaneously, the data cell formed of the diode 6 deposited between word line 4 and bit line 5 and the recording layer 7 are generated on the so-called self-alignment basis.

In these processes, the electrode pads 2C and 2B of the word line 4 and bit line 5 are formed very loosely on wider area in comparison with the word line 4 and bit line 5 (FIG. 6). Thereby, the word line 4 and bit line 5 may surely be connected to each electrode pad 2C and 2B by reducing the positioning accuracy at the time of pressing the stampers 21, 24. Accordingly, the data cell region 3 may be generated by as much simplified process.

Moreover, since the data cell region 3 itself may be generated by the thin film generating technique, transfer of protruded and recessed areas and etching process on the memory substrate 2 in the wider area, the process and facility may be as much simplified.

In the memory chip 1 manufactured as explained above, the data cells are selected depending on the address by the system region 2A when data 62 (FIG. 3) is to be recorded, the recording layer 7 forming each data cell changes its crystal structure with the heating/cooling process depending on the logical level (FIG. 4). On the other hand, when data is to be read, a resistance value is detected by a current value depending on the voltage to be applied, where the resistance value changes depending on the crystal structure. Thereby, the desired data may be recorded and reproduced.

Accordingly, in the case of recording the desired data through change of resistance value due to change of the crystal structure of such recording layer 7, the so-called refresh operation by the charge accumulation mechanism in the DRAM of conventional devices may be omitted and the memory chip may be structured with a much simplified structure.

(1-3) Effect of the First Embodiment.

According to the structure explained above, since the data cell region 3 is formed on the memory substrate 2 in which the system region 2A is manufactured, system region 2A may be produced on the memory substrate 2 and within the data cell region 3 using a design rule that is looser than that of the conventional art and thereby a larger capacity memory may be generated with so far simplified process.

Moreover, since the data cell region 3 is manufactured by a process that is different from the process of memory substrate 2, the data cell region 3 may be formed with a simplified process and, thereby, a large capacity memory may be generated with the more simplified process.

In more practical terms, since a data cell structure may be selected to record the desired data through change of resistance value due to the change of crystal structure of the recording layer 7, the memory of a more simplified structure may also be generated with a more simplified process. In addition, since the structure of a data cell may be more simplified than conventional semiconductor memory by means of the charge accumulating mechanism, the large capacity memory also may be generated in a much simplified structure.

In addition, since the word line and bit line electrode pads 2C, 2B may be structured in remarkably wider area with looser period in comparison with the word line 4 and bit line 5, the positioning process may be more simplified.

(2) Second Embodiment

Figure 9:
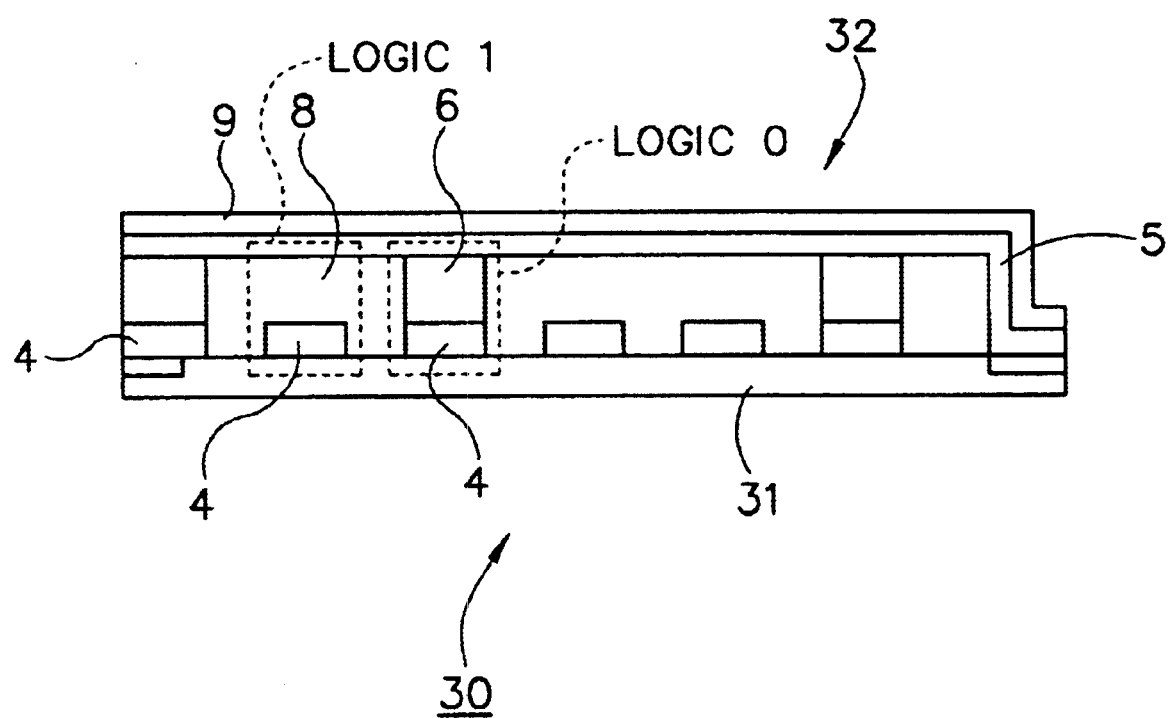
FIG. 9 is a cross-sectional view showing a chip as a second embodiment of the present invention.

In this embodiment, the present invention will be applied to a read only memory (ROM) rather than a memory that may be written as well as read (such as memory chip 1). FIG. 9 is a cross-sectional view showing a memory chip of this ROM. This memory chip 30 is formed by generating a data cell region 32 on the memory substrate 31.

Here, the memory substrate 31 is formed identical to the memory substrate 2 explained with reference to FIG. 2 and FIG. 3, except for the points that the input circuit 16 is omitted in the system region 31A (not shown) of the memory substrate 31 and the reproducing control signal 64A (not shown) is input in place of the recording/reproducing control signal 64.

Similar to the data cell region 3 explained in regards to FIG. 1, the data cell region 32 may include the word line 4, the bit line 5, and data cells disposed between the word line 4 and bit line 5. Each data cell is formed of a different structure depending on the logical level assigned to each data cell. For example, in the data cell to which logical 0 is assigned, a diode 6 is arranged between the word line 4 and bit line 5. On the other hand, in the data cell to which logical 1 is assigned, the interlayer insulating layer 8 is arranged between the word line 4 and bit line 5. Thereby, the data cell may hold the data with a resistance and may detect data held by the current flowing when the predetermined voltage is impressed without a need for recording layer 7.

Figure 10A:
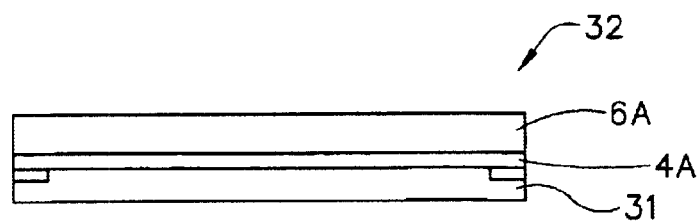
FIGS. 10A to 10E are cross-sectional views for explaining the generation of word lines in the data cell region of FIG. 9.
Figure 10B:
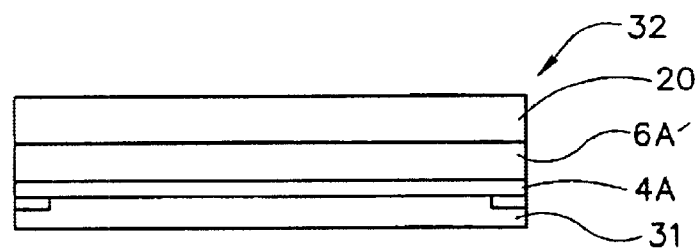

FIGS. 10A–10E are cross-sectional views showing the generating process of word line 4 in the data cell region 32. This data cell region 32 forms, like the first embodiment, the metal layer 4A to the entire surface of the memory substrate 31 (FIG. 10A). Subsequently, the data cell region 32 also forms the pn silicon layer 6A.

Figure 10C:
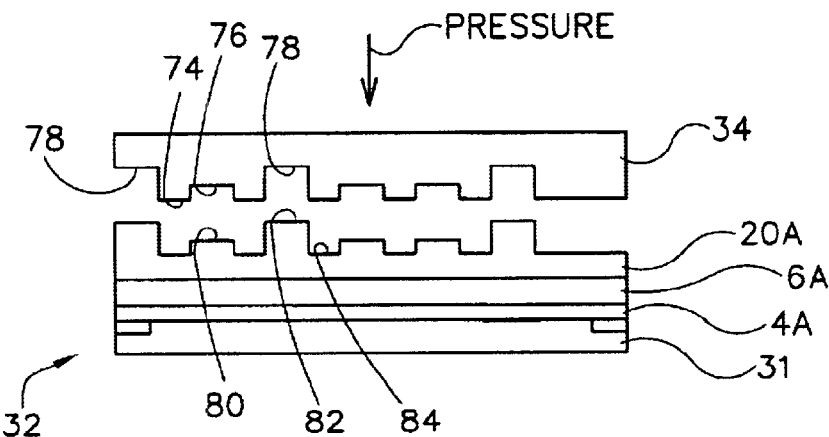
Figure 10D:
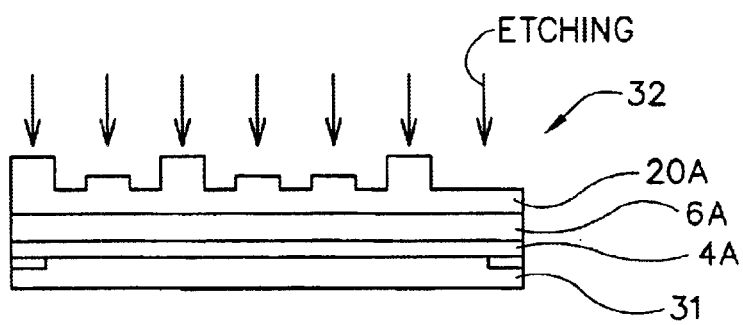

Subsequently, the data cell region 32 is subjected to coating of the ultraviolet-setting resin 20 on the pn silicon layer 6A (FIG. 10B), and is then subjected to the depressing of stamper 34 (FIG. 10C). After the ultraviolet-setting resin 20 is hardened to a resin 20A under this condition, the stamper 34 is peeled. In this step of this embodiment, the stamper 34 is formed in the recessed shape corresponding to the thickness of word line 4 and pn silicon layer 6A in the data cell to which the logical 0 is assigned, while it is formed in the recessed shape corresponding to the thickness of word line 4 in area between the data cell to which the logical 1 is assigned and the data cell in the extending direction of the word line 4. Thereby, in the data cell 32, the protruded 74 and recessed 76, 78 areas of stamper 34 is transferred by the so-called photo-polymerization (2P) method and the protruded 80, 82 and recessed 84 areas by the ultraviolet-setting resin 20A are formed on the pn silicon layer 6A.

On the occasion of generating the protruded 80, 82 and recessed 84 areas by depressing the stamper 34, it is provided with the recessed areas 76, 78 at the depressing surface to form the protruded areas 80, 82 corresponding to the shape of word line electrode pad 2C at the area overlapping with the word line electrode pad 2C as explained above in regard to FIG. 6. Therefore, the word line 4 may be connected to the electrode pad of the memory substrate 31 through the more simplified alignment.

Figure 10E:
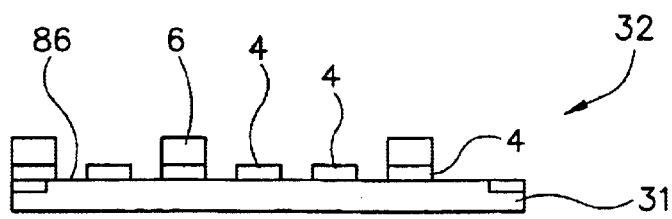

Subsequently, in the data cell region 32, uniform etching process is executed from the surface of ultraviolet-setting resin 20A to which the protruded 74 and recessed 76, 78 areas are transferred as explained above (FIG. 10D). Accordingly, the metal layer 4A and the pn silicon layer 6A are removed for the deepest recessed area of the ultraviolet-setting resin 30. Thereby, the space 86 is formed between the continuous word lines 4. Moreover, the pn silicon layer 6A is removed for the next deepest recessed area and the metal layer 4A and pn silicon layer 6A are also removed for the protruded area of the ultraviolet-setting resin 20A (FIG. 10E).

Thereby, the continuous word line 4 is formed and a diode 6 is arranged in the data cell to which logical 0 is assigned and the word line 4 is formed to be exposed in the data cell to which the logical 1 is assigned.

Figure 11A:
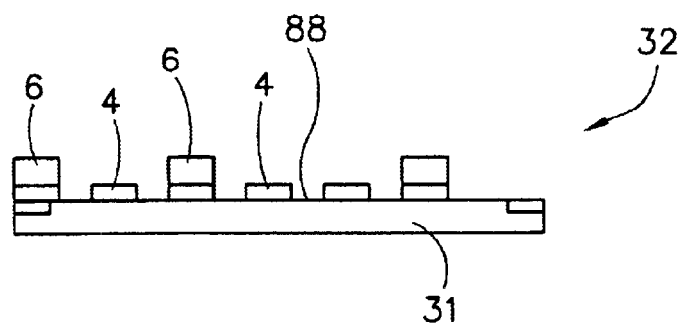
FIGS. 11A to 11C are cross-sectional views for explaining the subsequent processes of FIGS. 10A to 10E.
Figure 11B:
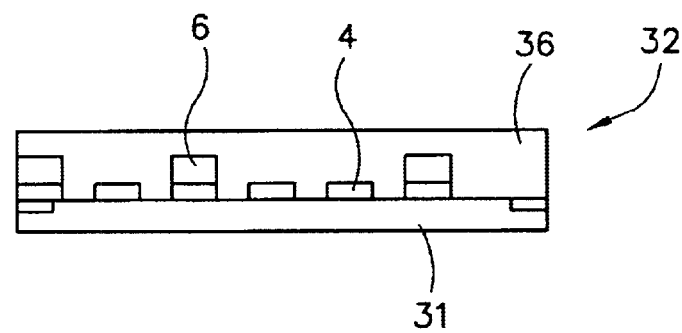
Figure 11C:
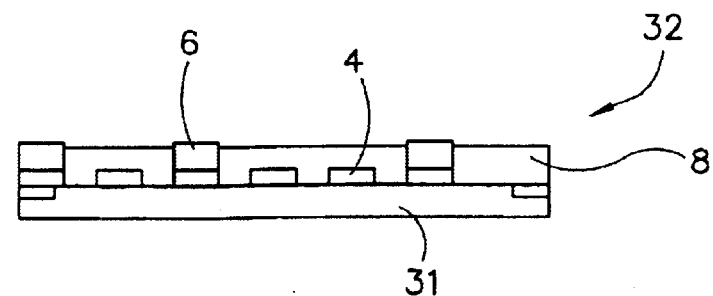

Next an insulating film 88 made of, for example, $SiO_2$ or $Si_3N_4$ is formed in the data cell region 32 and thereby providing electrical insulation between the word lines. As shown in FIGS. 11A and 11B, after a liquid resin, for example, an ultraviolet-setting resin 36, is coated in the data cell region 32 (FIGS. 11A and 11B), the resin is hardened to provide the flat surface thereof. Subsequently, the ultraviolet-setting region 36 is etched by an etching method that does not affect the metal layer 4A and pn silicon layer 6A such as, for example, oxygen plasma etching (FIG. 11C), and thereby the surface of the diode 6 which is protruded most from the memory substrate 31 may be exposed.

Thereby, in this embodiment, the interlayer insulating layer 8 is formed by the ultraviolet-setting resin 36. Moreover, in the data cell to which logical 1 is assigned, the interlayer insulating layer 8 of the ultraviolet-setting resin 36 is formed on the word line 4. Thereby, in this memory chip 30 (FIG. 9), the bit line 5 is generated as in the case of the first embodiment so that the resistance value becomes almost 0 ohms [$\Omega$] in the data cell of logical 0 and the resistance value becomes almost infinitive in the data cell of logical 1. In this case, the stamper 34 of memory chip 30 is positioned in the subsequent bit line generating process so that the bit line 5 is correctly formed on the surface of the exposed diode 6.

According to the structure shown in FIG. 9, the effect identical to the read/write memory first embodiment may be obtained by applying it to a read only memory (ROM).

(3) Third Embodiment

In the third embodiment, each data cell is generated based on the 0/1 logical level of the data cell. Then, the bit line 5 is generated at the time of generating the word line 4. In the case of the second embodiment, higher accuracy is required for alignment of the bit line 5. Therefore, in this third embodiment, the bit line 5 is generated in the simplified alignment accuracy.

Figure 12:
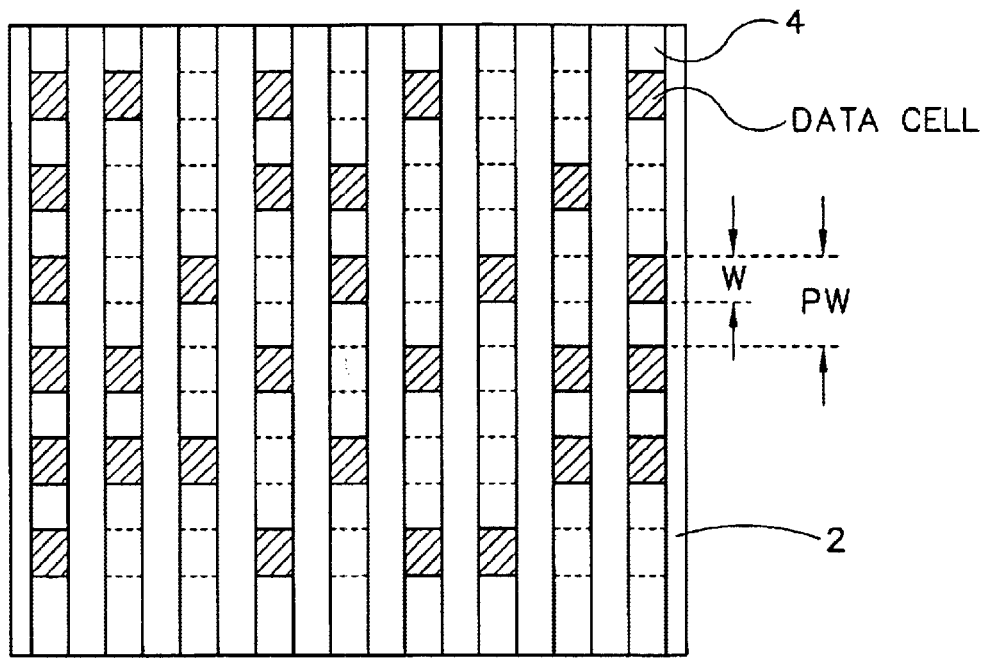
FIG. 12 is a plan view for explaining a memory chip as a third embodiment of the present invention.
Figure 13:
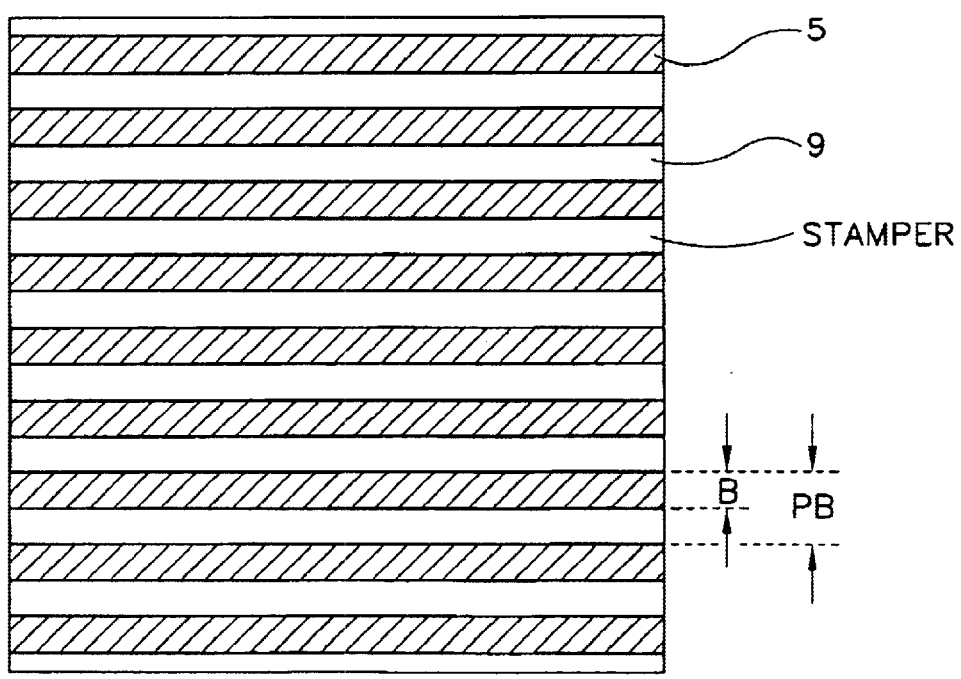
FIG. 13 is a plan view showing the bit lines in comparison with FIG. 12.
Figure 14:
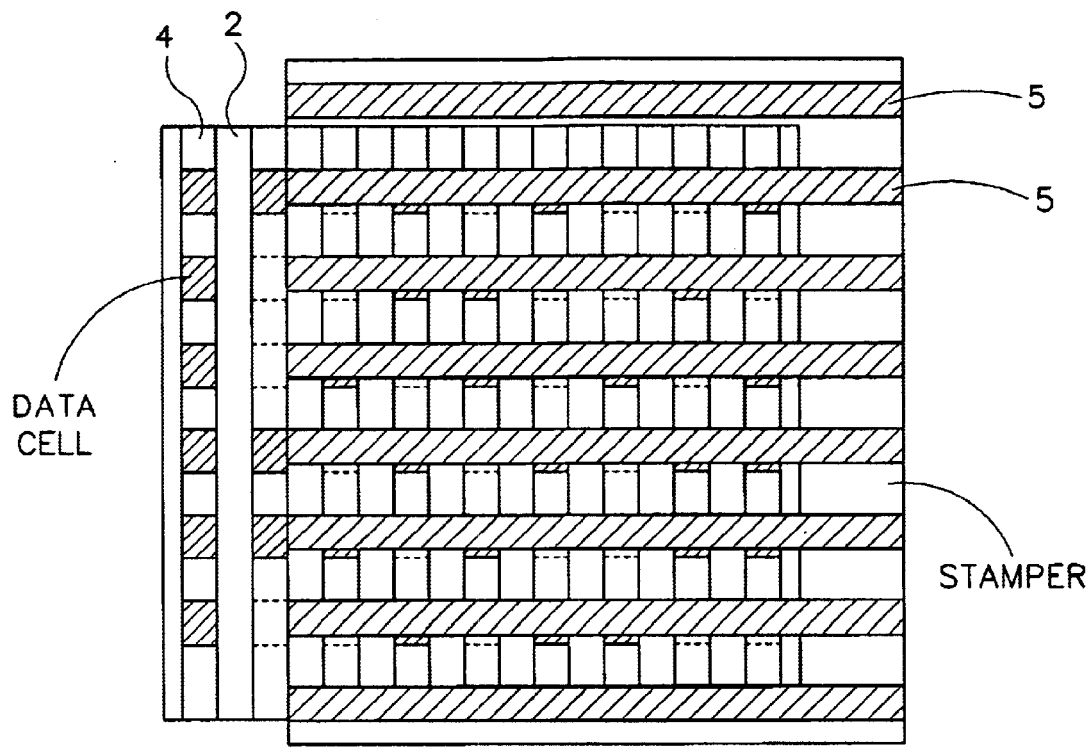
FIG. 14 is a plan view for explaining overlapping condition of the word lines and bit lines.

Namely, as shown in FIG. 12, the width of the data cell exposed so as to face the bit line 5 is defined as "W" and the repetition pitch of the data cell in the extending direction as "PW". In FIG. 12, the data cell exposing the diode 6 is indicated as the hatched areas. Moreover, as shown in FIG. 13, the line width of bit line 5 is defined as "B" and the repetition pitch as "PB". In this case, when the repetition pitch is defined as PW and it is assumed to be identical to PB, alignment accuracy of the line width B or less of the bit line 5 is required and the bit line 5 cannot be connected correctly to the data cell as shown in FIG. 14 depending on the simplified facility and process.

In this embodiment, therefore, the stamper 90 to transfer the shape of bit line 5 is provided with the protruded 92 and recessed 94 areas at the surface thereof to assure the large area to form the bit line 5 surrounding the area of data cell. Thereby, if the stamper 90 is depressed with the loose alignment accuracy with reference to the electrode pad 2C, the protruded 92 and recessed 94 areas of the bit line 5 may be formed accurately in the area where the data cell is arranged.

Figure 15:
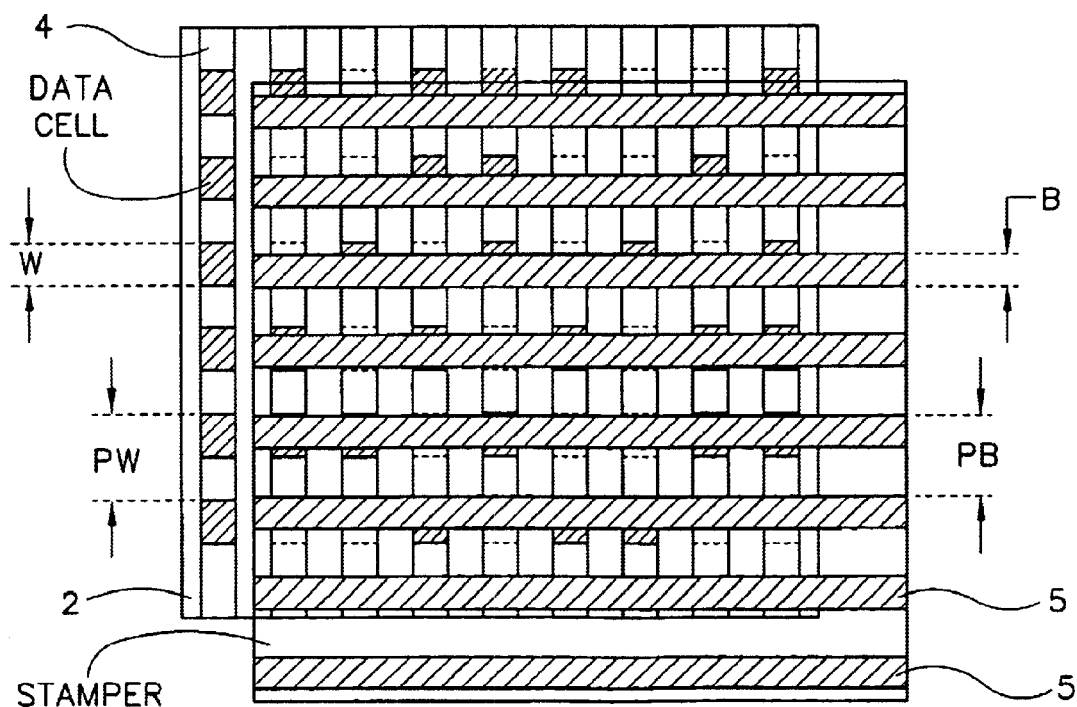
FIG. 15 is a plan view for explaining overlapping condition of the word lines and bit lines.

Moreover, the stamper 90 is set to show the following relationship between the repetition pitch PW of the data cell and repetition pitch PB of the bit line 5 as shown in FIG. 15 and thereby the repetition pitch PB of the bit line 5 becomes smaller than the repetition pitch PW.

$$PW > PB \quad (1)$$

Moreover, the stamper 90 is set to show the following relationship among the repetition pitch PW of data cell, width W of the data cell, repetition pitch PB of bit line 5 and width B of the bit line 5 and a certain word line 4 always overlaps on the data cell 6 arranged between these word lines in the adjacent word lines.

$$PB + B > PW - W \quad (2)$$

Moreover, the stamper 90 is also set to show the following relationship among the repetition pitch PW of the data cell, width W of the data cell and width B of the bit line 5 and, therefore, the adjacent word lines 4 overlap on only one data cell.

PW−W>B         (3)

Therefore, the memory chip of this embodiment is provided to surely connect the bit line 5 to each data cell by depressing the stamper 90 in the loose alignment accuracy with reference to the electrode pad 2B.

The stamper to form the word line 4 against the bit line 5 formed, as explained above, is provided with the protruded 92 and recessed 94 areas at the surface to record the reference data to the data cell in the specified area. For instance, this reference data may be recorded by forming the data cell in which the logical level of the particular pattern, for example, is continuous, on the predetermined word line.

The logical level of each data cell of this memory chip is inspected in the inspection process before delivery from the factory. Based on the inspection result, an offset value is given to the row address decoder 13 (FIG. 13). Thereby, relative displacement of bit line 5 is compensated with reference to this reference data.

According to the third embodiment, even when the read only memory is generated by generating the data cell simultaneously with the word line 4 formation, the read only memory may be manufactured through the simplified alignment.

(4) Fourth Embodiment

Figure 16:
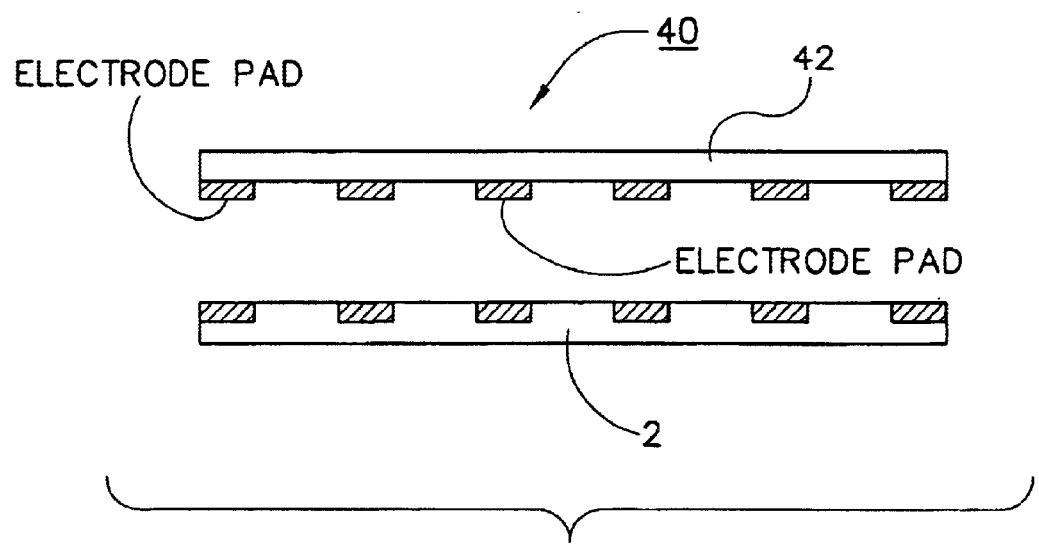
FIG. 16 is a cross-sectional view for explaining a memory chip as a fourth embodiment of the present invention.

FIG. 16 is a cross-sectional view showing a memory chip in relation to the fourth embodiment. This memory chip 40 is generated by stacking the data cell substrate 42 on the memory substrate 2.

Here, the data cell substrate 42 is manufactured by forming, on a flat plate member such as silicon, glass and plastic, etc., the word line 4, data cell, bit line 5 in the same manner as explained in regard to the first and second embodiment. Moreover, the data cell substrate 42 is connected to the memory substrate 2 by the surface mounting method such as the micro solder ball, unisotropic conductive material and micro bump bonding, etc.

The effect similar to that of the first and second embodiments may be obtained by manufacturing the memory chip by stacking the data cell substrate 42 on the memory substrate 2.

(5) Fifth Embodiment

Figure 17:
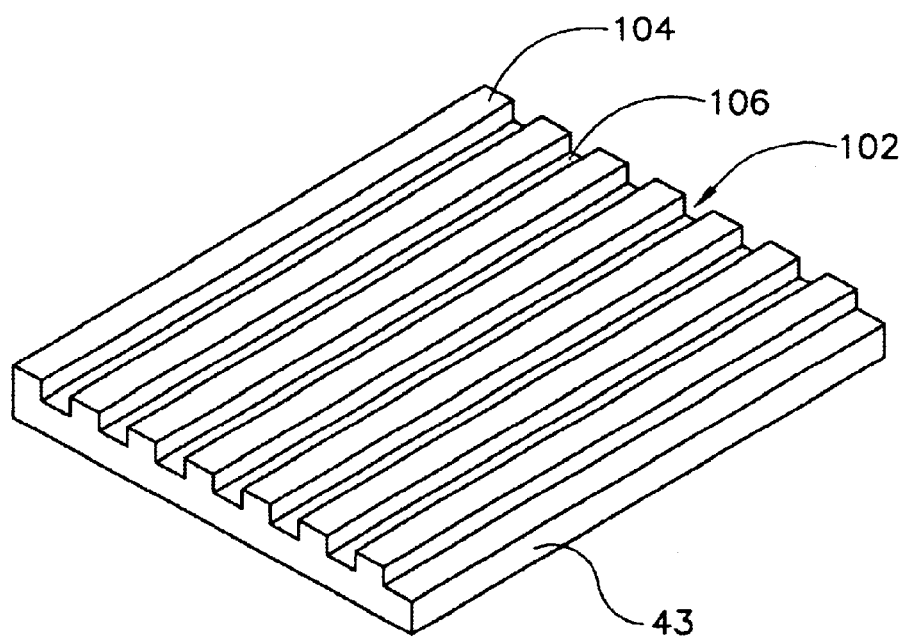
FIG. 17 is a perspective view showing a data cell substrate to be applied to a memory chip as a fifth embodiment of the present invention.

In this embodiment, after the word line 4, data cell and bit line 5 are formed on the data cell substrate 43 shown in FIG. 17, the memory chip by the random access memory is manufactured by stacking the memory substrate 2 as explained with reference to FIG. 16.

Namely, the data cell substrate 43 is manufactured by forming the groove 102 consisting of the protruded 104 and recessed 106 areas on the flat plate material of silicon, glass and plastic by the so-called photo-polymerization (2P) method or etching. The data cell substrate 43 also may be generated by the injection molding.

This groove 102 consisting of protruded 104 and recessed 106 areas is formed in such a manner that the protruded area 104 corresponds to the word line 4.

As shown in the cross-sectional view of FIG. 18 and FIGS. 19A–B, in the data cell substrate 43, after the metal layer 4A (FIG. 19B) is formed by the evaporation from the upper diagonal direction, the pn silicon layer 6A and recording film 7A are sequentially formed. In this case, since the evaporation (FIG. 18) is performed from the upper diagonal direction, the evaporation material is almost not deposited at the shadow area 108 of the protruded area of the data cell substrate 43. Accordingly, the metal layer 4A, pn silicon layer 6A and recording film 7A are formed only at the upper surface of the protruded area 104 and the side surface of this protruded area 104. Thereafter, the data cell substrate 43 is subjected, for example, to the isotropic etching such as wet etching to eliminate any evaporation material deposited in the shadow area 108 of the protruded area 104.

Thereby, the word line 4, pn silicon layer 6A deposited on the word line 4 and recording film 7A are formed in the data cell substrate 43 and then it is integrated with the memory substrate 2 through the interlayer insulating film 8 generating process of FIG. 7 and the bit line 5 and data cell generating process of FIG. 8.

According to this embodiment, the effect similar to that explained above may be obtained even when the word line 4 is formed conforming to the protruded 104 and recessed 106 shape formed on the substrate 43.

(6) Sixth Embodiment

Figure 20A:
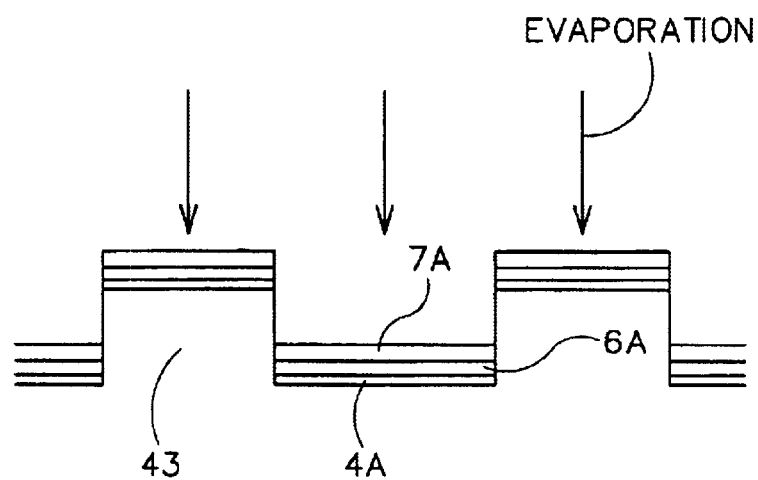
FIGS. 20A to 20C are cross-sectional views showing processes of generating word lines in the data cell substrate to be applied to a memory chip as the sixth embodiment of the present invention.
Figure 20B:
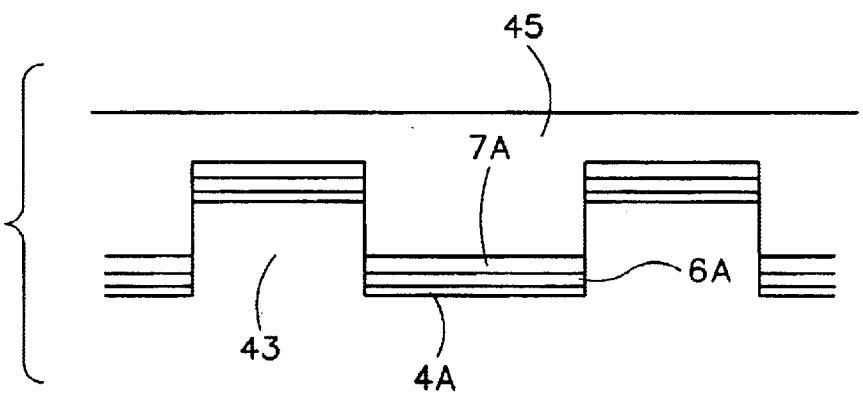
Figure 20C:
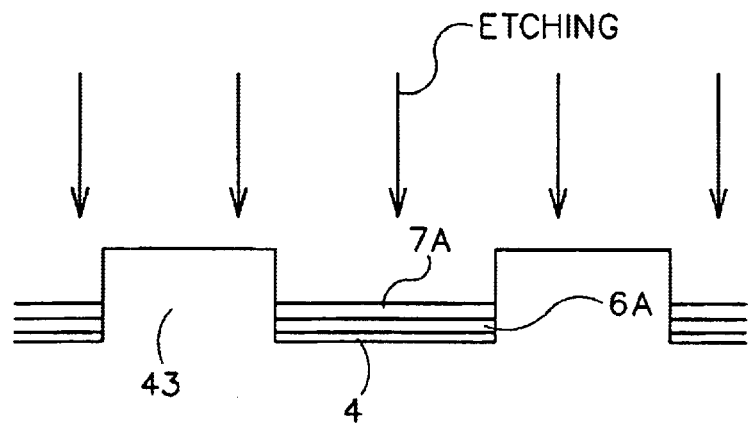

FIGS. 20A–C are cross-sectional views for explaining the word line 4 generating process as the sixth embodiment of the present invention. In this embodiment, the word line 4, pn silicon layer 6A and recording film 7A are generated by the process of FIG. 18 using the data cell substrate 43 explained in regard to FIG. 17.

Namely, in the data cell substrate 43, after the metal layer 4A is formed by evaporation from the upper direction, the pn silicon layer 6A and recording film 7A are sequentially formed (FIG. 20A). Thereafter, data cell substrate 43 is coated with the ultraviolet-setting resin and liquid resin 45 such as photoresist and the surface is flattened by hardening of the surface (FIG. 20B). Moreover, the etching process is executed in the film thickness direction to the data cell substrate 43. Thereby, the metal layer 4A, pn silicon layer 6A and recording film 7A are left at the recessed area of the data cell substrate 43 (FIG. 20C) and the word line 4 is formed in the data cell substrate 43 and the pn silicon layer 6A and recording film 7A are formed on this word line 4.

The data cell substrate 43 thereafter is integrated with the memory substrate 2, like the fifth embodiment, through the interlayer insulating layer 8 generating process shown in FIG. 7 and the bit line 5 and data cell generating process of FIG. 8.

According to this embodiment, the effect similar to that of the fifth embodiment may be obtained even when the word line 4 is formed in the recessed area of the data cell substrate 43.

(7) Seventh Embodiment

Figure 21:
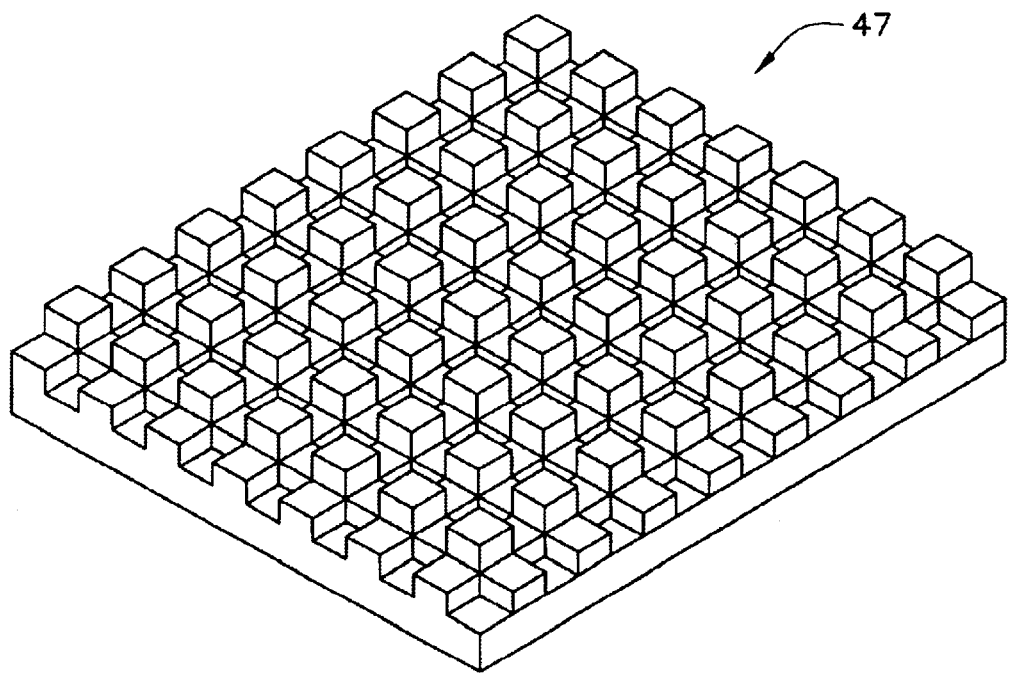
FIG. 21 is a perspective view showing a data cell substrate to be applied to a memory chip as a seventh embodiment of the present invention.

In this embodiment, after the word line 4, data cell and bit line 5 are formed on the data cell substrate 47 shown in FIG. 21, a memory chip by the random access memory is generated by stacking the memory substrate 2 as is explained in regard to FIG. 16.

Namely, the data cell substrate 47 is manufactured by forming the protruded and recessed areas on the flat plate material such as silicon, glass and plastic by the so-called photo-polymerization(2P) method or etching. The data cell substrate 47 also may be manufactured by the injection molding.

In the data cell substrate 47, the protruded and recessed areas are formed in one direction corresponding to the repetition of word line 4 and moreover the protruded and recessed areas are formed corresponding to the repetition of the bit line 5 in the direction orthogonal to such one direction. Namely, in the area where both word line 4 and bit line 5 are not arranged, the deepest recessed area is formed. Moreover, at the area where the word line 4 and bit line 5 are overlapped, the protruded area is formed in the shallowest depth and the remaining area where only the word line 4 or bit line 5 is arranged is formed in the intermediate depth of such protruded and recessed areas.

In the data cell substrate 47, the metal layer 4A is generated by the evaporation from the upper diagonal direction orthogonal to the extending direction of the word line 4 and thereafter the pn silicon layer 6A and recording film 7A are sequentially formed.

Figure 22:
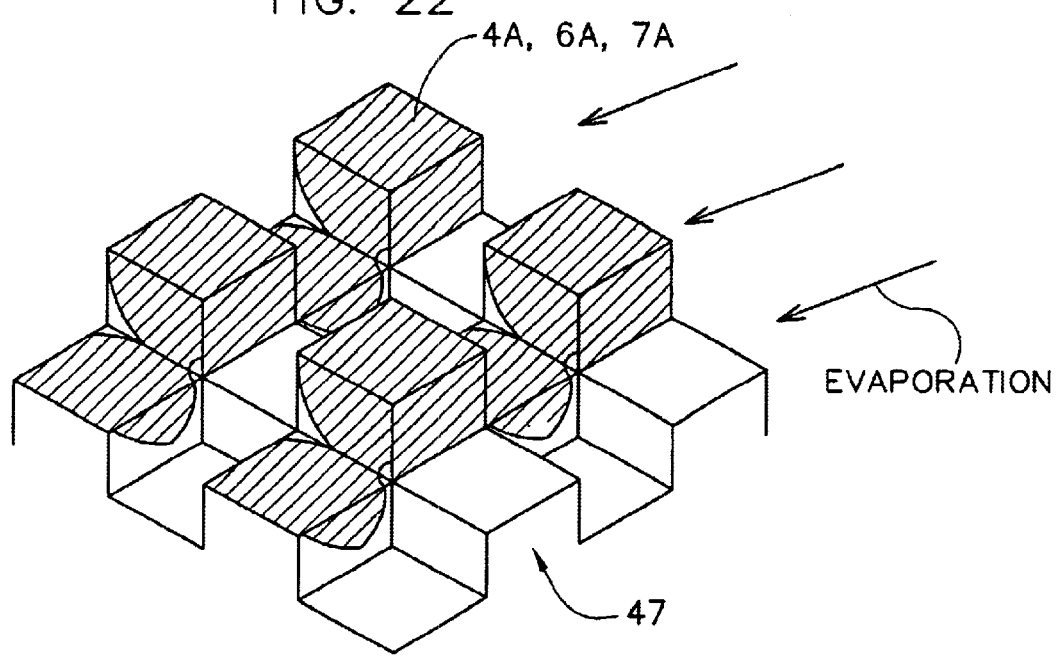
FIG. 22 is a perspective view showing a process of generating word lines by means of the data cell substrate of FIG. 21.

In FIG. 22, deposition of the metal layer 4A, pn silicon layer 6A and recording film 7A are indicated as the hatched areas. In this case, any evaporation material is deposited in smaller amount at the area near the corner of the recessed area and at the area near the corner in the deeper side of the side surface of protruded area, in addition to the shadow area. In the data cell substrate 47, the evaporation material adhered to the shadow area of these recessed areas is completely removed by the isotropic etching such as wet etching. Thereby, the word line 4 is formed in the data cell substrate 47 and the pn silicon layer and recording film are then formed on the word line 4.

Figure 23:
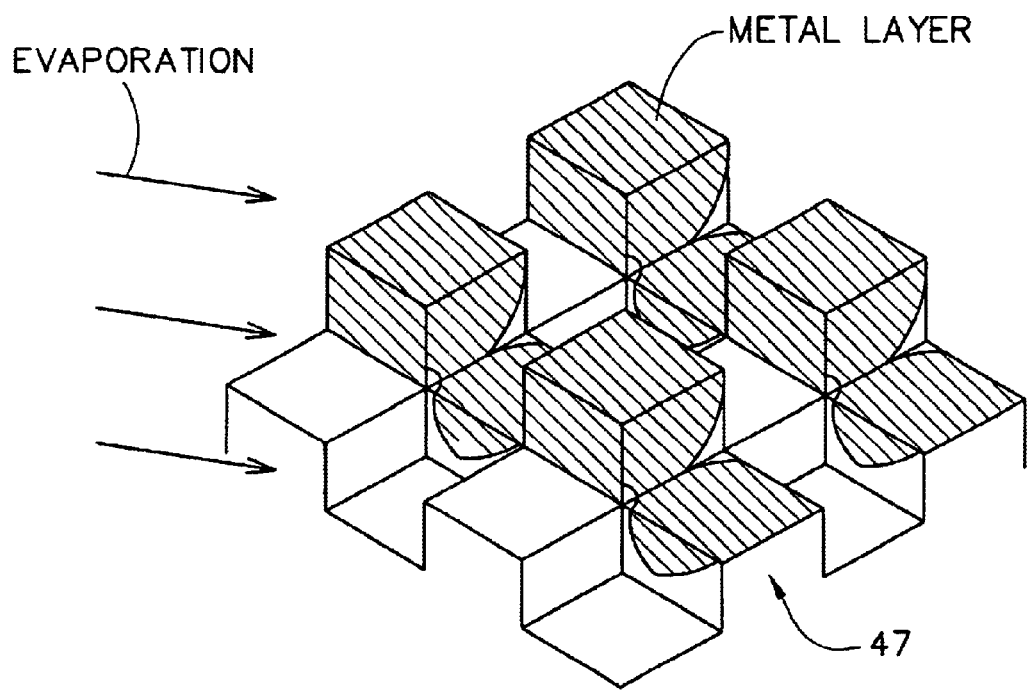
FIG. 23 is a perspective view showing a process of generating bit lines by means of the data cell substrate of FIG. 21.

Subsequently, as shown in FIG. 23, the metal material is deposited, in the data cell substrate 47, by the evaporation from the upper diagonal direction orthogonal to the direction when the work line 4 is generated. In this case, the evaporation material becomes small in amount at the areas near the corner of recessed area, corner at the deeper area of the side surface of the protruded area, in addition to the shadow area.

Figure 24:
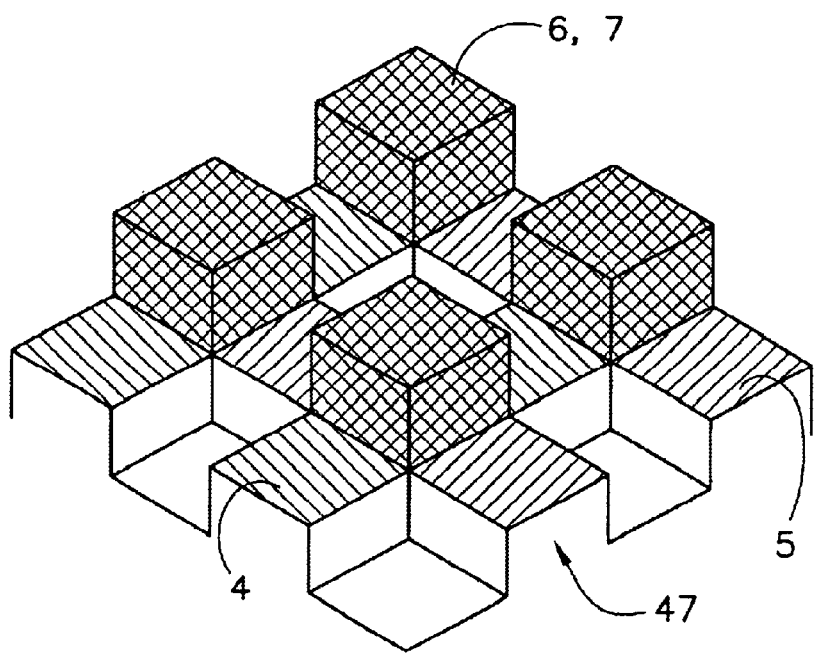
FIG. 24 is a perspective view showing relationship among word lines, bit lines and data cell by means of data cell substrate of FIG. 23.

Therefore, as shown in FIG. 24, in the data cell substrate 47, the word line 4 and bit line 5 are formed and the diode 6 by the pn silicon layer 6A and recording layer 7 by recording film 7A are formed at the protruded area where the word line 4 and bit line 5 are overlapping.

This data cell substrate 47 is integrated, after the evaporation material adhered to the shadow area of protruded area is completely removed, with the memory substrate 2, like the fifth embodiment, through the interlayer insulating layer 8 generation process of FIG. 7 and the bit line 5 and data cell generation process of FIG. 8.

According to this embodiment, the two-dimensional protruded and recessed areas are formed on the data cell substrate 43 and the effect similar to that of the fifth embodiment may be obtained even when the data line and word line 4 are formed following the protruded and recessed areas.

(8) Eighth Embodiment

Figure 25:
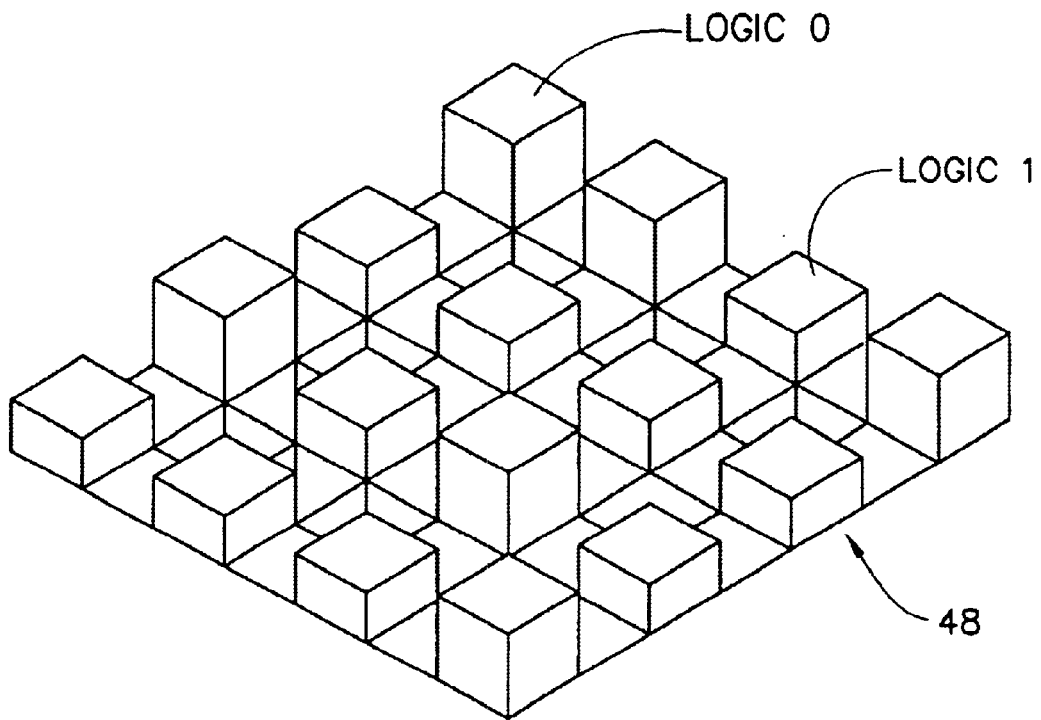
FIG. 25 is a perspective view showing a data cell substrate to be applied to a memory chip as an eighth embodiment of the present invention.

FIG. 25 is a perspective view showing enlarged data cell substrate as the eighth embodiment of the present invention in comparison with FIG. 21. In this embodiment, a read only memory is manufactured using this data cell substrate 48.

Namely, in the data cell substrate 48, the protruded and recessed areas are formed corresponding to the word line 4 and bit line 5 as in the case of the seventh embodiment. In this case, the protruded area (which becomes a part of the data cell) is formed in such a manner that the data cell of logic 1 is in the data cell substrate 48. As explained above, the data cell substrate 48 is formed in different heights of protruded area depending on the logical level and the metal layer 4A and pn silicon layer 6A are generated like the seventh embodiment.

Figure 26:
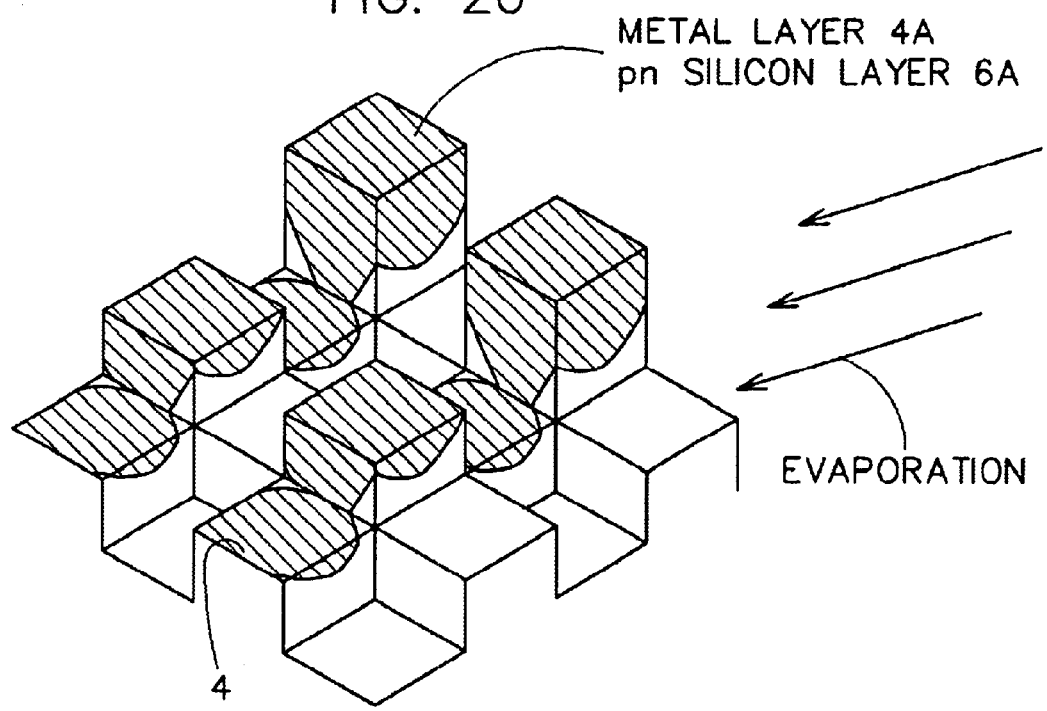
FIG. 26 is a perspective view showing a process of generating word lines by means of data cell substrate of FIG. 25.

Namely, as shown in FIG. 26, the metal layer 4A is generated in the data cell substrate 48 by the evaporation from the upper diagonal direction orthogonal to the extending direction of the word line 4. Thereafter, the pn silicon layer 6A is formed. In this case, since the evaporation is conducted from the upper diagonal direction, the evaporation material is almost not deposited at the shadow area of the protruded area in the data cell substrate 48. Moreover, the evaporation material becomes small in amount in the area near the corner of the recessed area and the area near the corner of the deeper side of the side surface of the protruded area.

Particularly, the evaporation material is adhered in wider area at the side surface of the bit line side of the protruded area protruded in large amount because of assignment of the logic 0 by selecting the evaporation condition, but the evaporation material is adhered in smaller area at the side surface of the bit line side of the protruded area protruded in large amount because of assignment of logic 0. In this data cell substrate 48, any evaporation material adhered partially to the shadow area of the protruded areas may be eliminated perfectly by the isotropic etching such as the wet etching. Thereby, the word line 4 is formed in the data cell substrate 48 and the pn silicon layer 6A is then formed on this word line 4.

Figure 27:
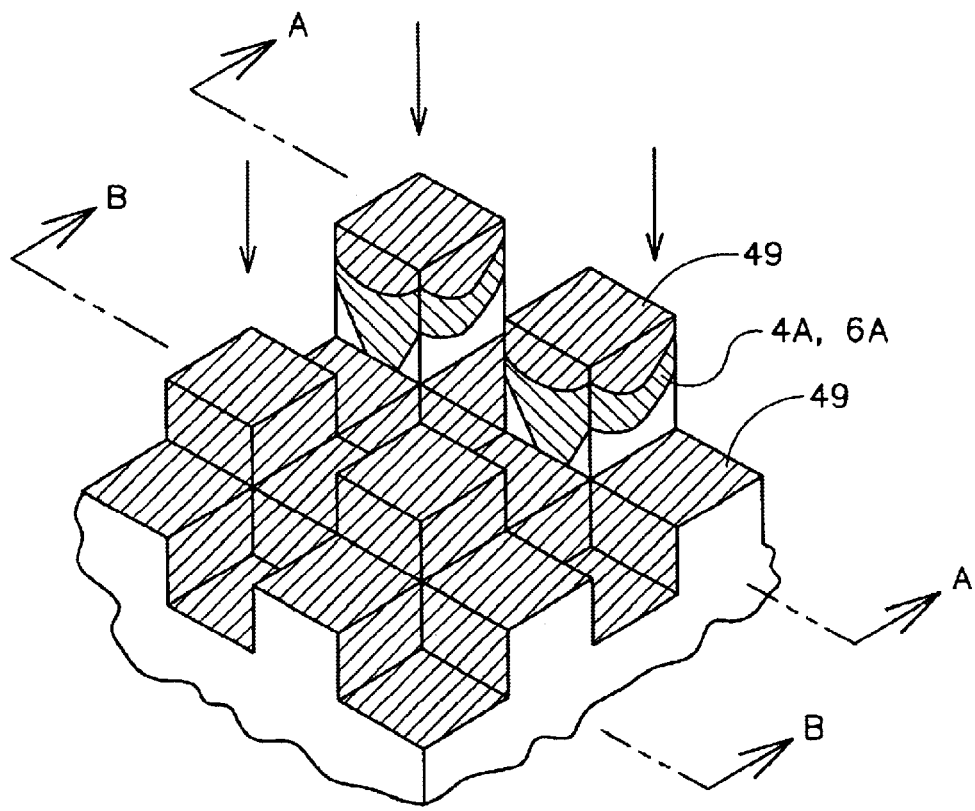
FIG. 27 is a perspective view showing a process of generating an insulation layer in the data cell substrate of FIG. 25.
Figure 28A:
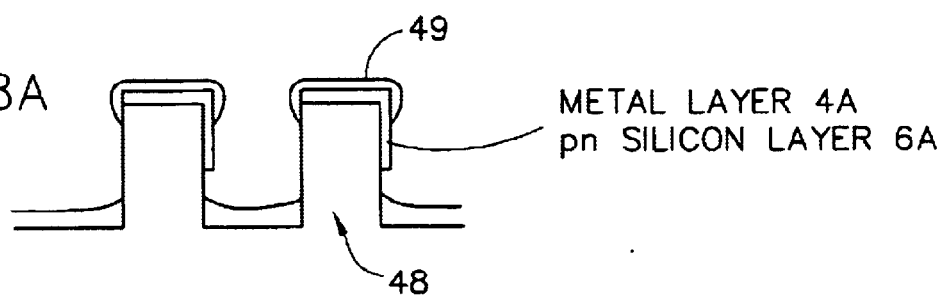
FIGS. 28A and 28B are cross-sectional views showing the portions cut at the lines A—A and B—B of FIG. 27.
Figure 28B:
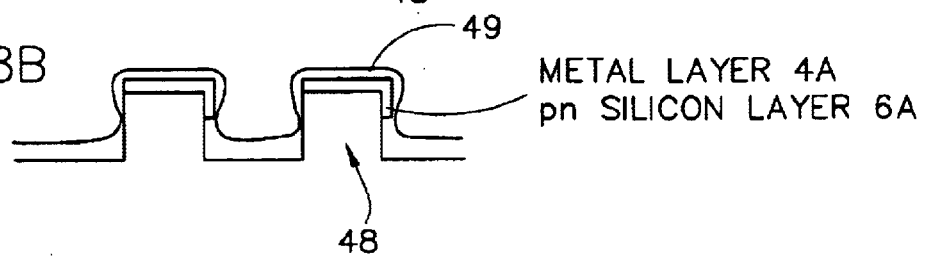

Subsequently, as shown in FIG. 27, the insulation film material is deposited by the evaporation from upper direction of the substrate surface to generate the insulating layer 49 in the data cell substrate 48. In this case, as shown in FIG. 28A showing the cross-sectional view along the line A—A, the insulating film material is deposited so that the metal layer 4A and pn silicon layer 6A are partially exposed at the side surface of the bit line side of the protruded area in large protrusion amount through assignment of logic 0 in the data cell substrate 48. Moreover, as shown in FIG. 28B showing the cross-sectional view along the line B—B, the insulating film material is deposited in the other area in such a manner that the surface is perfectly covered with the insulating layer 49.

Subsequently, the word line 4 is generated by the upper diagonal evaporation in the same manner as FIG. 23 in the data cell substrate 48 and thereby at the protruded area in large amount of protrusion to which logic 0 is assigned, the word line 4 and bit line 5 are held in the conductive condition sandwiching the diode 6 of the pn silicon layer 6A. At the protruded area in a small protrusion amount to which logic 1 is assigned, the word line 4 and bit line 5 are kept in the non-conductive condition by the insulating layer 49 and thereby data cell setting the logical level may be generated.

The data cell substrate 48 is integrated with the memory substrate 2 after any evaporation material partially adhered to the shadow area of the protruded area is perfectly eliminated.

According to this embodiment, the two-dimensional protruded and recessed areas are formed in the height corresponding to the logical level in the data cell substrate 43 and the effect identical to that of the fifth embodiment may be obtained even when the data line and word line 4 are formed conforming to such protruded and recessed areas.

(9) Other Embodiments

In the third embodiment explained above, alignment error is compensated by setting of the bit line 5, but the present invention is not limited thereto and it is also possible to compensate such error, for example, with an error correction circuit.

Moreover, in the fifth to eighth embodiments explained above, the data cell substrate is separately structured in addition to the memory substrate, but the present invention is not limited thereto and it is also possible to form the data cell region on the memory substrate by forming the protruded and recessed areas on the memory substrate, for example, by the photo-polymerization(2P) method.

In addition, in the first to fourth embodiments explained above, the data cell region is formed on the memory substrate, the present invention is not limited thereto and it is also possible, on the contrary, to form the memory substrate on the data cell substrate. In this case, the system region is formed by a circuit using the TFT, etc.

Moreover, in the embodiments explained above, the data cell is generated simultaneously when the word line 4 is generated or the bit line 5 is generated, but the present invention is not limited thereto and then it is also possible to provide the data cell generating process to form the data cell in separation from the time when the word line 4 is generated or the bit line 5 is generated.

In addition, in above embodiments, the data cell, word line 4 and bit line 5 are arranged on the data cell substrate, but the present invention is not limited thereto and it is also possible to arrange, for example, a part of the selection mechanism to select the word line 4 and bit line 5 on the data cell substrate. Thereby, connection between the data cell substrate and memory substrate may be as much simplified.

Moreover, or in place of above, it is possible to arrange a TFT transistor to drive each data cell.

In addition, in above embodiments, the desired data is held in the data cell with a resistance value, but the present invention is not limited thereto and it is also possible to form the memory chip with a so-called FeRAM structure by forming, for example, a recording layer with the ferrodielectric material film.

Moreover, in above embodiments explained above, the data cell region is formed conforming to the protruded and recessed areas by the stamper or conforming to the protruded and recessed areas of the data cell substrate, but the present invention is not limited thereto and it is also possible to apply the present invention to formation of the data cell region, for example, by the photoetching process using the mask.

Moreover, in above embodiments, the pn junction diode 6 is arranged in each data cell, but the present invention is not limited thereto and it is also possible to arrange the Shottky diode as required or to eliminate the diode.

Moreover, in the embodiments explained above, the data recorded to each data cell is reproduced by a current flowing when the predetermined voltage is applied, but the present invention is not limited thereto and it is also possible to reproduce data recorded in each data cell by detecting a voltage generated when the desired current flows.

In the embodiments explained above, the present invention is applied to a read only memory and random access memory, but the present invention is not limited thereto and it is also possible to generate a program memory which allows the recording operation only once by applying, for example, the material which changes non-inversely the composition to the recording film. Moreover, the present invention also may be applied to a memory including the read only memory, random access memory and program memory.

As explained previously, according to the present invention, a large capacity memory and an information apparatus using this memory may be manufactured with the simplified process by generating the data cell region with the process other than that for manufacturing the system region to control this data cell region.

What is claimed is:

1. A method of producing a memory chip comprising:
   presenting a memory substrate having a system region; and
   fabricating a data cell region on the memory substrate;
   wherein the memory substrate further includes a word line pad and a bit line pad, each disposed about the system region, and includes an external pad disposed about the word line pad and the bit line pad, wherein the word line pad is coupled to the plurality of word lines and the bit line pad is coupled to the plurality of bit lines.

2. The method of claim 1, wherein the system region includes
   a row address buffer coupled to the external pad and a row address decoder coupled between the row address buffer and the word line pad,
   a column address buffer coupled to the external pad and a column address decoder coupled between the column address buffer and the bit line pad,
   a sense amplifier coupled between the column address buffer and the bit line pad, and
   an output circuit coupled to the external pad and the sense amplifier.

3. The method of claim 2, wherein the system region further includes an input circuit coupled to the external pad, the sense amplifier, and the output circuit.

4. A method of producing a memory chip comprising:
   presenting a memory substrate having a system region; and
   fabricating a data cell region on the memory substrate, including:
   forming a first stack having a first resin,
   stamping the first resin,
   etching the first resin to form a plurality of adjacent first stacks,
   disposing a plurality of insulating layers between the plurality of adjacent first stacks,
   forming a second stack on each adjacent first stack, the second stack having a second resin,
   stamping the second resin, and
   etching the second resin to form a plurality of adjacent second stacks.

5. The method of claim 4, wherein forming a first stack having a first resin includes forming the first stack on the memory substrate in the following order: a metal layer on the memory substrate and a silicon layer on the metal layer.

6. The method of claim 5, wherein forming a first stack having a first resin further includes coating the silicon layer with the resin.

7. The method of claim 5, wherein the first stack further includes a recording film disposed on the silicon layer.

8. The method of claim 7, wherein forming a first stack having a first resin further includes coating the recording film with the resin.

9. The method of claim 4, wherein stamping the first resin includes
   placing the first resin under compression with a face of a first stamper, wherein the first stamper face includes a plurality of protruded and recessed areas, and
   hardening the first resin while the first resin is under compression.

10. The method of claim 9, subsequent to stamping the first resin, fabricating a data cell region on the memory substrate includes removing the first stamper from the resin.

11. The method of claim 4, wherein each of the plurality of adjacent first stacks includes a word line and a data cell.

12. The method of claim 11, wherein each data cell includes a diode and a recording layer.

13. The method of claim 4, wherein forming a second stack on each adjacent first stack includes forming a metal layer on each adjacent first stack.

14. The method of claim 13, wherein stamping the second resin includes
   placing the second resin under compression with a face of a second stamper, wherein the second stamper face includes a plurality of protruded and recessed areas, and
   hardening the second resin while the second resin is under compression.

15. The method of claim 14, subsequent to stamping the second resin, fabricating a data cell region on the memory substrate includes removing the second stamper from the resin.

16. The method of claim 4, wherein etching the second resin to form a plurality of adjacent second stacks includes forming a plurality of adjacent bit lines at an orientation that is orthogonal to a word line.

17. The method of claim 16, wherein fabricating a data cell region on the memory substrate further includes disposing a plurality of insulating layers between adjacent bit lines.

18. The method of claim 17, wherein fabricating a data cell region on the memory substrate further includes forming a protection layer on the plurality of adjacent bit lines.

19. A method of producing a memory chip comprising:
  presenting a memory substrate having a system region; and
  fabricating a data cell region on the memory substrate, including:
    presenting a data cell substrate having a plurality of protruded and recessed areas,
    forming a plurality of first stacks on the plurality of protruded and recessed areas,
    disposing a plurality of insulating layers between the plurality of adjacent first stacks, and
    forming a second stack on each adjacent first stack.

20. The method of claim 19, wherein the data cell substrate defines a data cell substrate axis that is normal to a plane of the data cell substrate and wherein forming a plurality of first stacks includes depositing at least one of a metal layer, a silicon layer, and a recording film onto the data cell substrate at an angle to the data cell substrate axis.

21. The method of claim 20, wherein depositing at an angle to the data cell substrate axis includes depositing from an upper diagonal direction.

22. The method of claim 20, wherein depositing at an angle to the data cell substrate axis includes depositing from an angle that is parallel to the data cell substrate axis.

23. The method of claim 20, wherein depositing at an angle to the data cell substrate axis includes depositing from a first angle and depositing from a second angle.

24. The method of claim 23, wherein depositing at an angle to the data cell substrate axis includes depositing at a first angle and depositing at a second angle.

25. The method of claim 23, wherein depositing at a first angle includes depositing from a first upper diagonal direction and wherein depositing at a second angle includes depositing from a second upper diagonal direction that is different from the first upper diagonal direction.

26. The method of claim 23, wherein one of the first angle and the second angle is parallel to the data cell substrate axis.

* * * * *